(12) United States Patent
Okojie

(10) Patent No.: US 6,845,664 B1
(45) Date of Patent: Jan. 25, 2005

(54) MEMS DIRECT CHIP ATTACH PACKAGING METHODOLOGIES AND APPARATUSES FOR HARSH ENVIRONMENTS

(75) Inventor: Robert S. Okojie, Strongsville, OH (US)

(73) Assignee: The United States of America as represented by the Administrator of National Aeronautics and Space Administration, Washington, DC (US)

(*) Notice: Subject to any disclaimer, the term of this patent is extended or adjusted under 35 U.S.C. 154(b) by 96 days.

(21) Appl. No.: 10/263,980

(22) Filed: Oct. 3, 2002

(51) Int. Cl.[7] .......... H01L 21/48; H01L 21/50; H01L 23/02; H01L 23/28; G01D 11/24

(52) U.S. Cl. .......... 73/431; 438/55; 438/64; 438/110; 438/112; 438/121; 438/127; 257/433; 257/678; 257/787

(58) Field of Search .......... 257/678, 701, 257/787, 414, 433; 438/48, 51, 55, 64, 66, 67, 106, 107, 110, 112, 117, 118, 119, 121, 124, 127; 73/431; 361/600, 820

(56) References Cited

U.S. PATENT DOCUMENTS

| | | | |
|---|---|---|---|
| 3,382,419 A | * 5/1968 | Hartman et al. | 257/747 |
| 3,896,480 A | * 7/1975 | Harnden, Jr. | 257/665 |
| 3,991,461 A | * 11/1976 | Anderson | 257/785 |
| 4,236,171 A | * 11/1980 | Shen | 257/584 |
| 4,764,747 A | 8/1988 | Kurtz et al. | |
| 5,087,964 A | 2/1992 | Hatta | |
| 5,165,283 A | 11/1992 | Kurtz et al. | |
| 5,296,730 A | 3/1994 | Takano et al. | |
| 5,539,252 A | * 7/1996 | Brorby | 257/678 |
| 5,552,347 A | 9/1996 | Takano et al. | |
| 5,592,018 A | 1/1997 | Leedy | |
| 5,629,538 A | 5/1997 | Lipphardt et al. | |
| 5,637,905 A | 6/1997 | Carr et al. | |
| 5,891,751 A | 4/1999 | Kurtz et al. | |
| 5,973,590 A | 10/1999 | Kurtz et al. | |
| 6,058,782 A | 5/2000 | Kurtz et al. | |
| 6,157,072 A | 12/2000 | Nakayama et al. | |
| 6,229,190 B1 | 5/2001 | Bryzek et al. | |
| 6,255,728 B1 | 7/2001 | Nasiri et al. | |
| 6,268,231 B1 | 7/2001 | Wetzel | |
| 6,319,740 B1 | 11/2001 | Heffner et al. | |
| 6,319,757 B1 | 11/2001 | Parsons et al. | |
| 6,321,654 B1 | 11/2001 | Robinson | |
| 6,322,247 B1 | 11/2001 | Bonne et al. | |
| 6,335,224 B1 | 1/2002 | Peterson et al. | |
| 6,346,742 B1 | 2/2002 | Bryzek et al. | |
| 6,361,206 B1 | 3/2002 | Bonne | |
| 6,365,433 B1 | * 4/2002 | Hyoudo et al. | 438/106 |
| 6,384,473 B1 | 5/2002 | Peterson et al. | |

* cited by examiner

*Primary Examiner*—Evan Pert
*Assistant Examiner*—Scott Geyer
(74) *Attorney, Agent, or Firm*—Kenneth L. Mitchell; Kent N. Stone

(57) ABSTRACT

Methods of bulk manufacturing high temperature sensor sub-assembly packages are disclosed and claimed. Sensors are sandwiched between a top cover and a bottom cover so as to enable the peripheries of the top covers, sensors and bottom covers to be sealed and bound securely together are disclosed and claimed. Sensors are placed on the bottom covers leaving the periphery of the bottom cover exposed. Likewise, top covers are placed on the sensors leaving the periphery of the sensor exposed. Individual sensor sub-assemblies are inserted into final packaging elements which are also disclosed and claimed. Methods of directly attaching wires or pins to contact pads on the sensors are disclosed and claimed. Sensors, such as pressure sensors and accelerometers, and headers made out of silicon carbide and aluminum nitride are disclosed and claimed. Reference cavities are formed in some embodiments disclosed and claimed herein where top covers are not employed.

76 Claims, 15 Drawing Sheets

US 6,845,664 B1

MEMS DIRECT CHIP ATTACH PACKAGING METHODOLOGIES AND APPARATUSES FOR HARSH ENVIRONMENTS

ORIGIN OF THE INVENTION

The invention described herein was made by an employee of the United States Government, and may be manufactured and used by the government for government purposes without the payment of any royalties therein and therefor.

FIELD OF THE INVENTION

The innovation describes various methods of fabricating packages used for protection of electronics and sensors in high temperature environments. Apparatuses made by the various methods of fabricating sensor sub-assemblies and their final packaging are also disclosed.

BACKGROUND OF THE INVENTION

My copending U.S. patent application Ser. No. 10/124,689; filed Apr. 12, 2002, entitled MULTI-FUNCTIONAL MICRO ELECTROMECHANICAL DEVICES AND METHOD OF BULK MANUFACTURING SAME discloses and claims a method of bulk manufacturing SiC sensors, including pressure sensors and accelerometers. The disclosure of my copending application is incorporated herein by reference.

I am a named inventor of U.S. Pat. No. 5,637,905 to Carr et al. and it discloses a high temperature pressure and displacement microsensor made from a Si substrate. A first coil structure is positioned within a recess in the Si substrate. A pressure diaphragm is glass bonded about its periphery to the rim of the recess in the semiconductor substrate. A second coil structure is positioned on the underside of the pressure diaphragm and is electrically isolated from the first coil structure. The coils are inductively coupled together and provide an output indicative of changes in the coupling between the coils.

My U.S. Pat. No. 6,248,646 discloses a process for making an array of SiC wafers on standard larger industry sized wafers. This patent discusses the operating conditions for SiC and SiC-On-Insulator technology and cites the need for sensors made from SiC.

U.S. Pat. No. 5,973,590 to Kurtz et al. discloses a hermetically sealed semiconductor sensor bonded to first and second glass wafers.

U.S. Pat. No. 6,319,757 BI to Parsons et al. discloses a silicon-carbide wafer bonded to an underlying ceramic substrate. The '757 patent states at col. 6, lns. 7–13 that the silicon carbide semiconductor substrate is a SiC die and the underlying substrate is polycrystalline aluminum nitride. Parsons et al. further states that the expansion coefficients of aluminum nitride and silicon carbide are nearly identical in the aforementioned structure and that of the borosilicate (BSG) glass encapsulant is close enough to both silicon carbide and aluminum nitride so as to avoid separation or cracking over a wide temperature range. Parsons et al. also teaches a flip chip application in FIG. 3 thereof encapsulated in glass.

U.S. Pat. No. 5,891,751 to Kurtz et. al describes curing a glass frit bonding the cover to the transducer. Upon curing, the glass frit becomes the peripheral glass layer 106. During the curing process, gasses are created which escape through an aperture designed for the purpose of the escaping gasses. According to the '751 patent, the aperture prevents the glass frit from bubbling and out gassing during the curing process which would prevent a hermetic seal along the periphery of the structure. The aperture accordingly must be within the inner periphery of the glass. See, the '751 patent at col. 7, lns. 5–17. In FIG. 1 herein reference numeral 100 is used to indicate the prior art drawing FIG. 7 of the '751 patent. Referring to FIG. 1 herein, Kurtz et al. identify transducer 101 which includes silicon (Si) diaphragm 103 and dielectric 102 (silicon dioxide). Glass 106 bonds silicon (Si) cover member 105 to the transducer (sensor). Aperture 108 permits out gassing during curing so as to not ruin the glass bond 106 and the seal it makes. Piezoresistors 109 reside on the dielectric 102. Glass bottom cover 104 includes aperture 107. In FIG. 2 herein, reference numeral 200 identifies the prior art drawing FIG. 8 of the '751 patent illustrating electrostatic bonding of glass sheet 201 to the top cover 105 to seal aperture 108 under vacuum conditions. Contact pads 202 are exposed in the prior art.

FIG. 3 herein is a duplicate of FIG. 4 of U.S. Pat. No. 6,058,782 to Kurtz et al. Reference numeral 300 signifies one of the hermetically sealed ultra high temperature silicon carbide pressure transducers of the '782 patent which has been cut or diced. See, col. 3, lns. 52–54. Referring to FIG. 3, silicon carbide first substrate 302 having unnumbered piezoresistors thereon bonded to silicon carbide second substrate 303 by electrostatic bonding or by glass frit bonding. See, col. 6, lns. 9–23 of the '782 patent. If bonded by a glass frit the same is not illustrated in the '782 patent as no space is shown between substrates 302 and 303 in FIG. 3. Further no provision or illustration is made for the escape aperture which must reside in second substrate 303 which might be referred to herein as the cover. Sensor 302 and cover 303, bonded together are illustrated as being in engagement with header 304 which carries a glass insulator (unnumbered) bonded to the top cover. Referring again to FIG. 3, leads 301 are illustrated in engagement with a platinum glass frit 305 electrically communicating with contact pads 306.

Referring to FIG. 3, the second substrate 303 is mounted atop glass which is unnumbered in FIG. 3. Since the glass expands at a rate of thermal expansion which is different than the substrate 303, stress is applied to the second substrate which may cause the separation of the pins 301 from the contact pads 306 of the first substrate. Stress may also be applied to the piezoresistors on the first substrate inducing measurement error.

The use of electrostatic bonding method makes very weak bond strength between the SiC sensors and the SiC cover. This may lead to debonding during thermal cycling thereby rendering the device useless. Application of glass frits as the adhesion material between the SiC cover and the SiC sensor makes necessary the creation of an aperture as an escape path for out gassing during glass bonding. Since the aperture will have to be sealed later in order to maintain the desired hermetic reference cavity, it increases the risk of the sealant sipping into the reference cavity.

There is growing demand for improved efficient management of energy consumption in jet engines and automobiles. Global reduction of undesirable emissions of hydrocarbons and other combustion by-products such as oxides of nitrogen and carbon monoxide are being sought assiduously. Semiconductor based sensors and electronics targeted for insertion in high temperature, extreme vibration, and corrosive media must satisfy a set of minimum reliability criteria before becoming acceptable for operational use. In addition, it is crucial to validate the Computational Fluid Dynamics codes generated for flow fields and turbulent conditions inside engines. Validation of these codes is necessary to render them trustworthy. Devices capable of functioning in these harsh environments need the appropriate package to sustain stable and reliable operation during the life of the device. Package reliability problems have largely contributed to prevent the application of these devices.

Typically these devices operate in environments of 300° C. and above. This is very challenging since conventional semiconductor electronic and sensing devices are limited to operating in temperatures less than 300° C. due to the limitations imposed by material properties and packaging. Silicon carbide-based electronics and sensors have been demonstrated to operate in temperatures up to 600° C. thereby offering promise of direct insertion into the high temperature environment. However, the lack of the device (sensor) packaging methodologies appropriate for this harsh environment has affected the operational reliability and survivability of these devices (sensors). Reliability problems at high temperature due to poor packaging has discouraged global application and large-scale commercialization of these devices. As such, the much anticipated introduction of SiC devices into high temperature environments has been delayed.

SUMMARY OF THE INVENTION

The basic components comprise a bottom substrate member of a dielectric material with thermomechanical properties similar or closely similar to that of silicon carbide, silicon or aluminum nitride. The bottom cover substrate member serves as a receiving platform for the silicon carbide sensors. The sensors may also be made of aluminum nitride or silicon. It also serves as the first level of protection of the sensor from harmful particulates in the high temperature environments in which the sensor is employed. Typically, the bottom substrate has a hole or aperture therein which allows pressure and/or temperature to be transmitted to the sensor. The top cover substrate made from the same material as the bottom substrate provide sandwiched protection for the sensors. Because they are made of the same material with thermomechanical properties similar to that of the sensors, the problem of mismatch in the coefficient of thermal expansion associated with the prior art is significantly reduced.

The bottom substrate includes housings in an array formed by walls. Between the walls of the housings are gaps or openings. The housings are sized to accommodate the insertion of similarly shaped, but smaller, sensors. The top substrate includes top covers in an array. The top covers are similarly shaped to the sensors which they cover but are smaller. In this way, when the bottom and top substrates sandwich the sensors together the peripheries of the top cover, the sensor and the housing are exposed so that glass may seal and bind them together. The top substrate includes larger gaps than the bottom substrate to enable glassing before cutting or dicing the sandwiched array into individual sensor sub-assemblies.

The manufacture of the sensors are taught in my copending U.S. patent application Ser. No. 10/124,689, filed Apr. 12, 2002, entitled MULTI-FUNCTIONAL MICRO ELECTROMECHANICAL DEVICES AND METHOD OF BULK MANUFACTURING SAME. The bottom and top substrates of the instant invention can be manufactured using the teachings of my copending application. The drawing figures used herein do not illustrate the piezoresistors on the sensors but it will be understood by those skilled in the art that where the term sensor is used it shall include but not be limited to the sensors as described in my application referenced herein. The packaging methodologies and apparatuses disclosed herein are not limited solely to the sensors of my invention as set forth in my copending patent application but may include sensors of a different design as well as prior art sensors.

The top cover substrate has several important features. First, it has four through holes spread equidistantly. These holes accept wires or pins that are used to make intimate contact with the contact pads on the sensor. A shallow circular or rectangular recess is located on one face of the top cover substrate and this is known as an over-pressure protection or reference cavity. When the top cover substrate is placed on the bottom cover substrate, the recessed cavity in the top cover substrate faces down so that the moving part of the sensor (i.e. a diaphragm in the case of a pressure sensor or an inertial mass in the case of an accelerometer) lies within its peripheral boundary. Several types of high temperature glasses exist that are used for providing hermetic sealing for the sensor after encasement between the top and bottom substrates. The pins that are inserted into through holes of the top cover substrate can be made of platinum, gold or nickel. Various embodiments of a stainless steel screw housing and Kovar header are applied either separately or together in the fabrication and assembly process for the final packaging. Kovar is a trademark of Westinghouse Electric Corporation and is an iron-nickel alloy used in making metal to glass seals.

Methods of bulk manufacturing high temperature sensor sub-assembly packages are disclosed. Sensors are sandwiched between a top cover and a bottom cover so as to enable the peripheries of the top covers, sensors and bottom covers to be sealed and bonded securely together are disclosed. Sensors are placed in the bottom covers leaving the periphery of the bottom cover exposed. Likewise, top covers are placed on the sensors leaving the periphery of the sensor exposed. Individual sensor sub-assemblies are inserted into final packaging elements which are also disclosed.

Methods of directly attaching wires or pins to contact pads on the sensors are disclosed. Sensors, such as pressure sensors and accelerometers, in combination with headers made out of silicon carbide and aluminum nitride are disclosed. Reference cavities are formed in some embodiments where top covers are not employed.

The basic method of bulk packaging sensors comprises the steps of placing a bottom substrate having an array of sensor housings in a holding device to receive sensors, inserting a sensor having contact pads in each housing of said bottom substrate, and, placing a top substrate having an array of covers onto each respective sensor. The peripheries of the top covers, sensors and bottom covers are then secured and hermetically sealed with glass and then cut or diced into individual sensor sub-assemblies. The sub-assemblies can be further packaged into final packaging.

The housings (cells) are substantially rectangularly shaped and include a rectangular perimeter wall having an inside portion and an outside portion. Each sensor includes a substantially rectangular perimeter shorter in length than the rectangular perimeter wall of each housing. Each top cover has a substantially rectangular perimeter shorter than the perimeter of each sensor. Each sensor has the same, but proportionally smaller, rectangular shape as the housing (cell) walls and the top cover has the same, but proportionally smaller, rectangular shape as the sensor. In this way a portion of the bottom housing between the sensor and the walls of the housing are left exposed for glassing. Similarly a portion of the top of the sensor is left exposed for glassing.

This creates a step-like appearance in cross-section which enables glassing over the perimeter or peripheries and avoiding out gassing concerns which plague the prior art of Kurtz et al. discussed above. Each sensor includes a plurality of contact pads and each top cover includes a plurality of bores or through holes. A plurality of pins (nickel, gold or platinum) extend through the bores of the top covers and engage the plurality of contact pads. Conductive paste resides in the bores in the top covers for securing the pins to the top covers and the contact pads. Glass secures the pins to the top of the top covers to add further mechanical rigidity to the pins.

A method of direct contact attachment of a pin to a contact pad on a sensor is disclosed and comprises dipping one end of the pin into a high temperature conductive paste that cures at a temperature less than the softening point of the glass used for sealing, inserting the pin coated with conductive paste until it engages the contact pad, firing the assembly to a temperature to cure the conductive paste, cooling the assembly, applying glass to the pin and the top cover to secure the pin to the cover, and, firing the assembly to the glass curing temperature. Optionally, the step of filling the through hole partially with nickel may be performed before dipping the pin in the conductive paste and inserting the pin in the through hole such that the pin engages the nickel.

A packaged sensor sub-assembly comprising just a sensor and a top cover glassed to a Kovar header which has been fused to a stainless steel housing is disclosed. Alternatively a packaged sensor sub-assembly comprising a bottom member, a sensor and a top cover may be glassed to a Kovar header which has been fused to a stainless steel housing.

A method for packaging a sensor sub-assembly, comprising the steps of: brazing a Kovar header to a stainless steel housing, inserting the sensor sub-assembly into the Kovar header, and, glassing the sensor sub-assembly to the Kovar header is disclosed. The steps of inserting the sensor sub-assembly into the Kovar header and glassing the sensor sub-assembly to the Kovar header are performed before the step of brazing the Kovar header to the stainless steel housing.

Alternatively, a sensor subassembly may be inserted into a stainless steel housing having threads on the interior of the housing. The threads, sensor sub-assembly and the pins are then glass sealed within threaded housing. Preferably, the glass seal length should be at least 10 times the thickness of the sensor sub-assembly. And, the interior threads should include at least 5 ribs. The stainless steel housing will also preferably include threads on the exterior thereof so as to enable mounting to equipment or processes to be monitored.

A sensor subassembly housing comprising a stainless steel housing having an interior and an exterior and which includes threads thereon is disclosed. A ceramic tube resides in the interior of the stainless steel housing. Brazing resides intermediate the interior threads of the stainless steel housing and ceramic tube and secures the ceramic tube and the stainless steel housing together when heated. The ceramic tube has first and second ends and the first end is smoothened so as to be coplanar with the wires or pins residing in bores of the ceramic. A blow-out stopper of at least 100 mils is used to ensure that the ceramic is not pushed out of the housing when the housing is coupled with a sensor sub-assembly. A particulate shield is used on the housing which protects the sensor sub-assembly when installed in the housing. A thermocouple passes through the ceramic tube in one of the bores.

A sensor sub-assembly is secured to the stainless steel housing and the ceramic tube by glass creating a reference cavity. Metal bumps may be used on the contact pads of the sensor to facilitate connection to the wires (pins). Alternatively, through holes in the top cover may be filled with nickel so as to form a transconnect and the transconnect, in turn, engages the metal bumps. Glass secures the top cover, sensor, transconnect and bottom housing together forming a reference cavity bounded by the top cover, sensor and glass. The top cover includes top and bottom surfaces and said transconnect extends radially from the through holes onto the top and bottom surfaces of the top cover.

A sensor sub-assembly housing comprising a stainless steel tube, a ceramic tube having through holes, a reference cavity, and an opening therein are disclosed. The ceramic tube is partially brazed to the stainless steel tube. The ceramic tube extends outside the stainless steel tube a sufficient length to thermally decouple the stainless steel tube from the sensor. Through holes of the ceramic tube are aligned with the contact pads of the sensor. Conductive pins residing in the through holes and engage the contact pads of the sensors. Conductive paste secures the pins to the through holes. Glass secures the sensor, bottom housing and ceramic housing together.

A method of packaging a sensor comprising the steps of: dropping a sensor sub-assembly into a stainless steel housing, inserting sealing glass into the interior of the housing, and, curing the sealing glass is disclosed. The stainless steel housing includes exterior threads for affixing the sensor to a process to be measured.

A method of packaging a sensor sub-assembly comprising the steps of: inserting a ceramic tube inside a stainless steel housing, the ceramic tube having through holes, and the stainless steel housing includes an interior having threads thereon, inserting brazing material in the gap intermediate the stainless steel housing and ceramic tube such that the brazing material is conformal to the interior threads, heating the brazing material and securing the ceramic tube to said stainless steel housing, inserting a sensor sub-assembly having contact pads into the stainless steel housing in alignment with the through holes of the ceramic tube and in proximity to the ceramic tube, and, inserting and heating glass to secure the sensor sub-assembly to the ceramic tube and the stainless steel housing forming a reference cavity is disclosed.

Pins coated with a conductive or non-conductive paste are inserted into the through holes of the ceramic tube and into engagement with the contact pads. Heating the paste secures the pins to the ceramic tube and contact pads. A metal bump may be placed on each of the contact pads prior to the step of inserting the sensor sub-assembly having contact pads into the stainless steel housing in alignment with the through holes of the ceramic tube and in proximity to the ceramic tube. An additional step in the process may include inserting a blow-out stopper in the interior of the stainless steel tube prior to heating the brazing material and securing the ceramic tube to the stainless steel housing. Another step to the process may include attaching a particulate shield to the stainless steel housing to protect the sensor sub-assembly.

Another method of packaging a sensor sub-assembly in a stainless steel housing having an interior and an exterior is disclosed. This method discloses the steps of: coating pins with paste, inserting the coated pins into a ceramic tube having through holes, placing the coated pins inside the through holes in the ceramic tube and heating the paste to secure the pins to the ceramic tube, smoothening one end of the ceramic tube and the pins located therein such that the end of the pins are coplanar with the ceramic tube, attaching pins to bumps on contact pads of a sensor, heating the ceramic tube and the sensor and bumps on the contact pads, prewetting the interior of a stainless steel housing with a glass paste, inserting the ceramic tube and sensor in the interior of the prewet stainless steel housing, inserting additional glass to secure the sensor to the ceramic tube and the stainless steel housing to form a reference cavity, firing the ceramic tube, the sensor and the stainless steel housing to cure the glass.

The step of firing the ceramic tube, the sensor and the stainless steel housing to cure the glass is performed at 800 degrees centigrade for 30 minutes in a nitrogen ambient environment. The step of heating the ceramic tube and the sensor and bumps on the contact pads is performed at 650 degrees centigrade.

A method of packaging a sensor sub-assembly in an aluminum nitride header partially secured within a stainless steel housing having an interior, an exterior and a reference cavity formed therein with the sensor sub-assembly including contact pads is disclosed. The method comprises the steps of: coating the aluminum nitride header with a metallic material; inserting the aluminum nitride header having four through holes therein into the stainless steel housing, attaching the metallic material (i.e., nickel) to the stainless steel housing, coating through hole openings with conductive paste, inserting conductive pins in the through holes coating the holes with conductive paste, heating the header, stainless steel housing, pins and conductive paste so as to cure and harden the conductive paste, reapplying the conductive paste on the cured and hardened conductive paste which is proximate the reference cavity, inserting the sensor sub-assembly in the reference cavity such that the sensor contact pads are aligned with the through holes of the aluminum nitride header, heating and bonding the sensor sub-assembly to the reference cavity such that electrical conductivity may be established between the contact pads and pins, and, sealing between the aluminum nitride header and sensor locking air (or vacuum if desired) between the reference cavity and the sensor. The step of attaching the metallic material to the stainless steel housing may be performed by laser welding. The step of attaching the metallic material to the stainless steel housing may be performed by brazing.

Accordingly, it is an object of the invention to effect the various methods of fabricating packages used for protection of electronics and sensors in high temperature environments. It is a further object of the invention to produce apparatuses made by the various methods of fabricating sensor sub-assemblies and their final packaging.

It is an object of the invention to produce and utilize semiconductors having similar coefficients of thermal expansion (CTE) such as aluminum nitride, silicon and silicon carbide. Therefore, because the sensor is sandwiched by aluminum nitride or silicon carbide, very little CTE mismatch exists. Therefore, minimal thermomechanically-induced stress is transmitted to the device. As a result, fatigue is greatly minimized and the lifetime of device operation is extended.

It is an object of the invention to employ glass coupled to the sensor sub-assembly. Since the glass does not adhere well to the stainless steel, it is partially de-coupled ensuring that less stress is transmitted to the sensor and also that the CTE of the glass is close to the CTE of the sub-assembly unit. The sensor and the cover members are partially enveloped in high temperature glass to provide hermetic sealing of the reference cavity. The only section not covered in glass is the sensor diaphragm.

It is an object of the invention to employ pins attached to the top cover substrate by first wetting the pins in conductive paste before inserting them into the through holes. The conductive paste in turn wets the previously fired gold paste that is used to hold the sensor and the top cover member together. At this point, the pins are in direct contact with the sensor.

It is an object of the invention that the aluminum nitride is fabricated by MEMS-EDM (electro-discharge method) and/or deep reactive ion etching.

It is an object of the invention to use inner threading of a stainless steel housing as a mechanical anchor making it possible to circumvent the problem of glass adhesion to stainless steel. In this design, the glass will anchor itself to the stainless steel and provide a tortuous path for a leak.

It is an object of the invention to eliminate the Kovar header and directly braze the ceramic to the stainless steel as shown.

It is an object of the present invention to use a blowout stopper as a safety mechanism.

It is an object of the present invention to bulk manufacture very high temperature sensor sub-assemblies, cut or dice them into individual sensors, and then final package the sensors for use in measuring process variables.

It is an object of the present invention to bulk manufacture very high temperature sensor sub-assemblies by sealing and securing the peripheries of the individual components of the sub-assemblies with glass.

It is object of the present invention to final package a sensor sub-assembly in a stainless steel housing using a Kovar header brazed to the stainless steel housing. The Kovar header may be first brazed to the housing followed by insertion of the sensor sub-assembly with the sensor sub-assembly then being glassed to the Kovar header. Alternatively, it is a further object to first secure the sensor sub-assembly to the Kovar header and then insert the header and sensor sub-assembly into the stainless steel housing.

It is an object of the invention to directly attach the wires (pins) to the contact pads of the sensors. Conductive paste is applied along the length and ends of the wires or, alternatively, it is applied at the entrance to the through holes of the top cover such that when the wires are inserted in the through holes they pick up some of the conductive paste and distribute it along the wire securing the wire to the through holes and the contact pads upon curing of the paste.

It is an object of the invention to provide glass attachment of the wires (pins) to the top cover to provide reinforcement and rigidity of the attachment of the wires to the top substrate.

It is an object of the invention to provide a stainless steel housing having interior threads. Typically this housing is a screw housing but it can really take on any shape or configuration imagined by the artisan. It is a further object to attach glass to the interior screw threads or ribs and the sensor subassembly. Preferably, the glass engages numerous courses of screw threads or ribs over a long length which provides a prohibitively tortuous path for any leakage gas from the process to pass.

It is a further object of the present invention to employ a ceramic tube for insertion into the stainless housing. The tube may be affixed to the interior of the housing using brazing and/or glass affixed to interior threads on the housing. It is a further object still that the tube includes passageways or through holes in which the wires reside and align with the contact pads. Additionally, a passageway or through hole in the tube accommodates a thermocouple lead.

It is a further object of the present invention to provide a metal bump of approximately 5 microns out of plane on the contact pads of the sensors to facilitate engagement of the wires (pins) to the contact pads. In another embodiment of the invention, a transconnect of nickel fills the through holes of the top cover and engage either the contact pads of the sensor directly or the metal bumps on the contact pads. The metal bumps can be made of gold, silver, platinum, nickel, titanium, tantalum silicide, or platinum or any combination thereof.

It is a further object of the present invention to provide a housing for a sensor-sub assembly wherein a stainless steel tube is employed and inserted within the tube is a generally cylindrically shaped aluminum nitride header having a coating of braze material thereon. The aluminum nitride header is affixed to the stainless steel tube upon heating of the housing. The aluminum nitride extends considerably outside the stainless steel tube so as to effectively thermally decouple the aluminum nitride from the stainless steel housing providing thermal stability to the header and to a sensor mounted within the header. A reference cavity is included in the header and the header acts as the top cover. In this embodiment no top cover is used as its function is supplied by the aluminum nitride header. The reference cavity is sealed when the sensor is glassed to the header.

A better understanding of the objects of the invention will be had when reference is made to the Brief Description Of The Drawings and the claims which follow hereinbelow.

A better understanding of the drawings and invention will be had when reference is made to the Description of the Invention and claims which follow hereinbelow.

DESCRIPTION OF THE INVENTION

Figure 4:
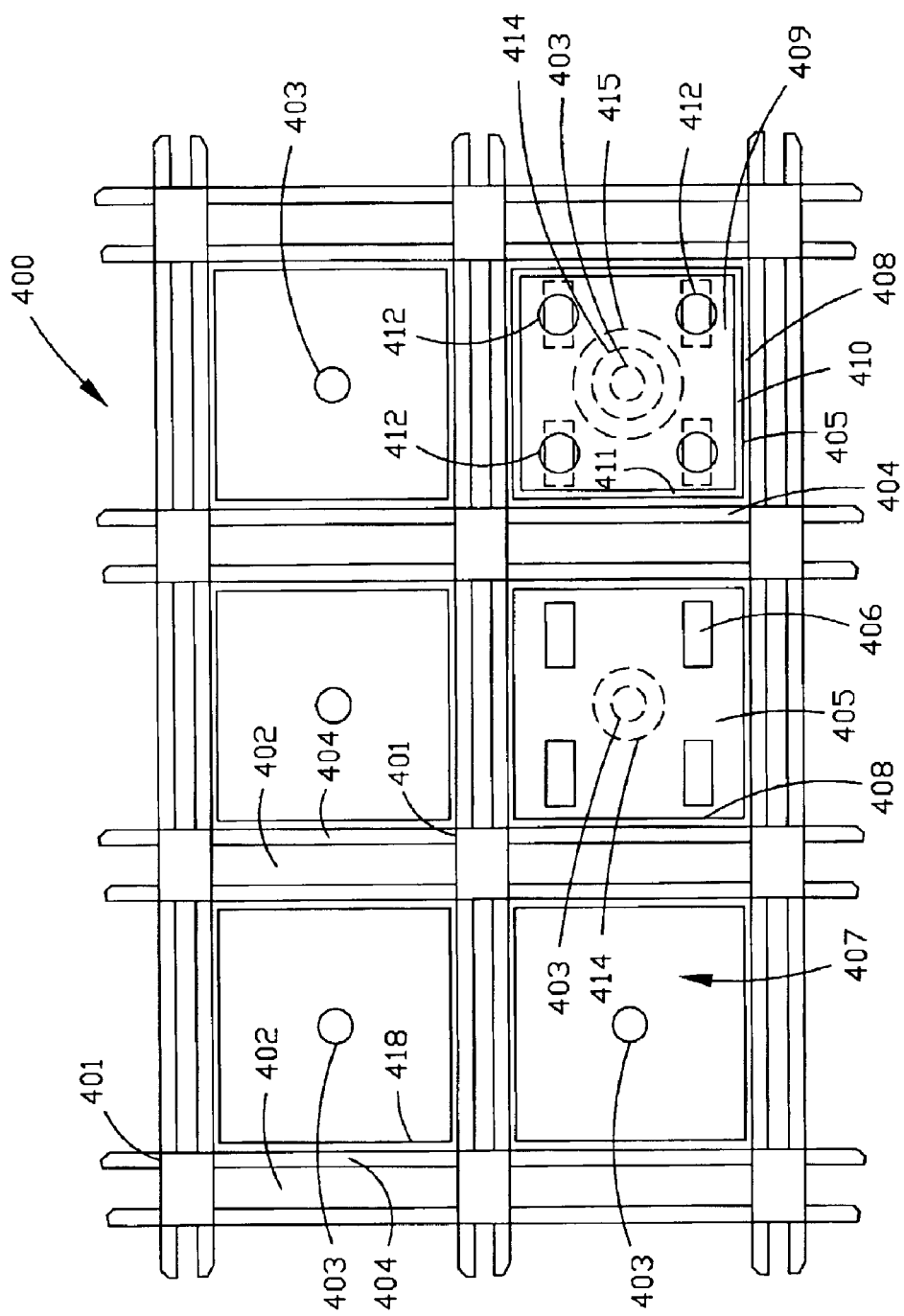
FIG. 4 is a plan view of the instant invention illustrating a portion of the bottom cover or substrate, a sensor in the housing of one cell of the bottom cover substrate, and a sensor in another cell of the bottom cover along with the top cover residing above the sensor. The top cover has been shown diagrammatically and without the rest of the top cover substrate.

FIG. 4 is a plan view 400 of the instant invention illustrating a section of the array of the bottom cover or substrate 402, a sensor 405 in the housing of one cell 407 of the bottom cover substrate 400, and a sensor 405 in another cell 407 of the bottom cover substrate along with the top cover 409 residing above the sensor 405. Top cover 409 is illustrated diagrammatically and is shown not connected to the array of which it is a part.

In one embodiment, each sensor or electronics chip 405 is dropped into the corresponding cells 407 arranged in an array 400 as shown in FIG. 4. The cell-array 400 is made from material that will survive high temperatures up to 700° C. such as aluminum nitride or silicon carbide, preferably in amorphous form for reduced cost without loss of performance. It will also have thermomechanical properties close to that of the material in which the chip 405 is made. Typically, the sensor chip will be made from silicon carbide or aluminum nitride as taught in my copending patent application referred to above and incorporated herein by reference. The port hole 403 in each cell 407 allows pressure to be applied to the diaphragm 414 on the sensor 405 if the sensor requires such. The depth of the recess of the cell 407 and its width will be such that it accommodates the chip as shown in the example of FIGS. 4 and 6.

Figure 5:
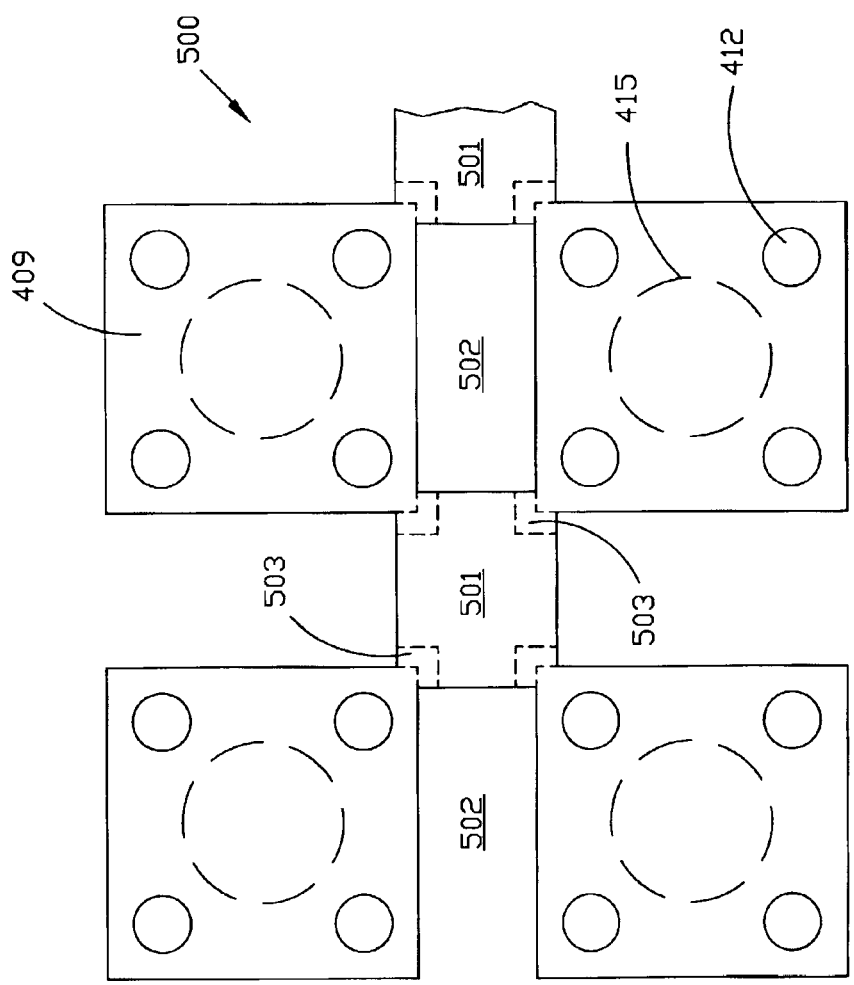
FIG. 5 is a plan view a portion of the top cover with a portion thereof undercut so as to permit a hermetic glass seal of the top cover, sensor and bottom substrate.
Figure 6:
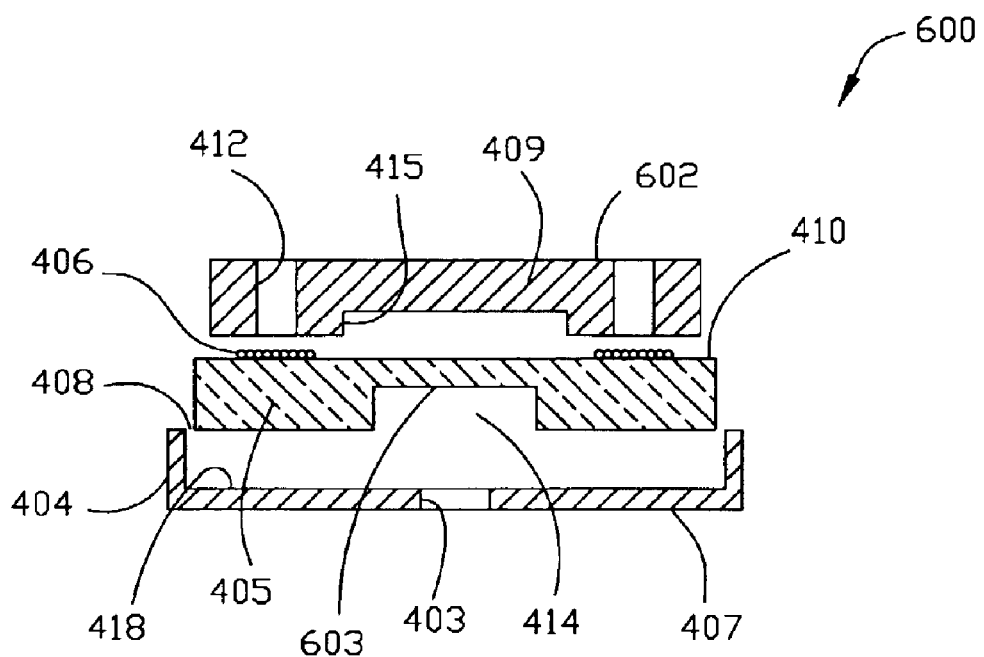
FIG. 6 is a diagrammatic cross-sectional view of a single cell of the array illustrating the housing of the bottom substrate or cover, a sensor together with contact pads, and a top cover with a reference cavity and bores for receiving pins.

After the sensors 405 are inserted into the recess of cell 407 as shown in FIGS. 4 and 6, an arrayed prefabricated top cover substrate 500 as shown in FIG. 5 is aligned and placed over the bottom cover substrate 400. One of the top covers 409 is shown in FIG. 4 without the remainder of the structure of the array 500 of the top cover substrate. Top cover 409 illustrates a reference cavity 415 which may be a pressurized cavity or a vacuum reference cavity. If the substrates are glassed under vacuum conditions then the reference cavity will be at or near zero psia.

Figure 8:
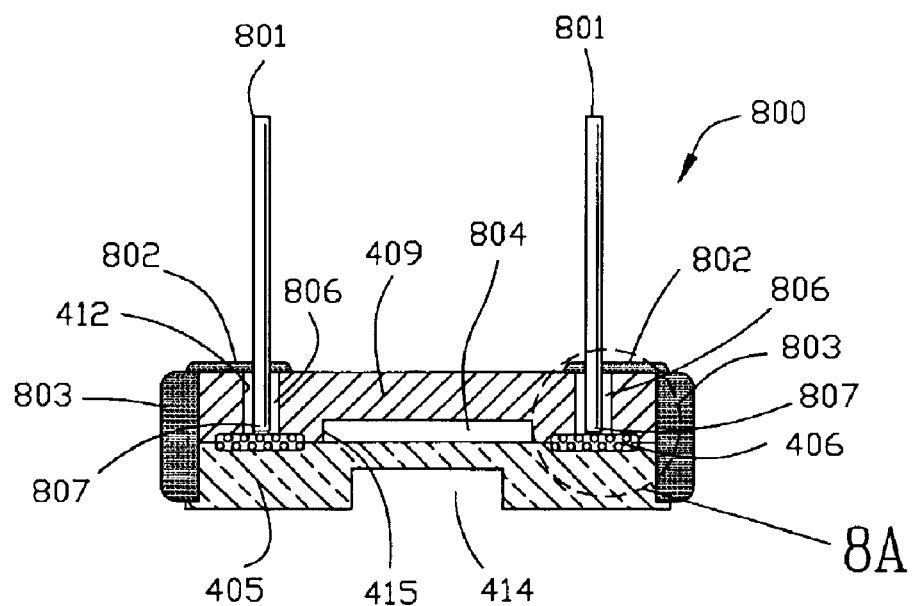
FIG. 8 is a cross-sectional view illustrating pins attached to contact pads by conductive paste. The pins are first attached to the pads with conductive paste used to secure them to the holes and to the pad. Next, glass paste is used to further secure the pins to the top cover to provide mechanical rigidity of the pins.

The four circular through-holes 412 in the top cover substrate 409 are designed to accept wires that will make intimate mechanical and electrical contact with the corresponding contact pads 406 of the sensors resident in the recessed cell array of FIG. 4. Thus each sensor 405 in a cell 407 has four contact pads 406 in intimate contact with the pins. Pins 801 are shown in FIG. 8 and may be gold, platinum, nickel or alloys of refractory metals.

FIG. 5 is a plan view 500 of the top cover substrate. Referring to FIG. 4, the array 400 is formed by joining sections 401 and gaps 402 between walls 404 which define recesses or cells 407. Recesses or cells 407 include a bottom portion 418 having an aperture 403 therein. Referring again to FIG. 5, joining portions or tabs 501 support top covers 409. Tabs 501 include undercut portions 503 which enable complete glassing of the top cover substrate to the sensors and the bottom cover substrate. Undercut portions 503 may take on different geometry as desired to effect complete hermetic sealing. Tabs 501 may take other forms including bridge formations enabling glassing patterns so as to enable complete encasing and hermetic sealing of the top cover substrate to the sensors and the bottom cover substrate. Gaps 502, wider than gaps 402, are illustrated in FIG. 5. The wider gaps facilitate application of the glass prior to heating and dicing the sandwiched substrate into individual sensor sub-assemblies. Referring again to FIG. 4, reference numeral 408 illustrates the portion of the bottom substrate which is not covered by the sensor 405 and reference numeral 410 represents the portion of the sensor 405 which is not covered by the top cover 409. Reference numeral 415 indicates the reference cavity in top cover 409.

Figure 1:
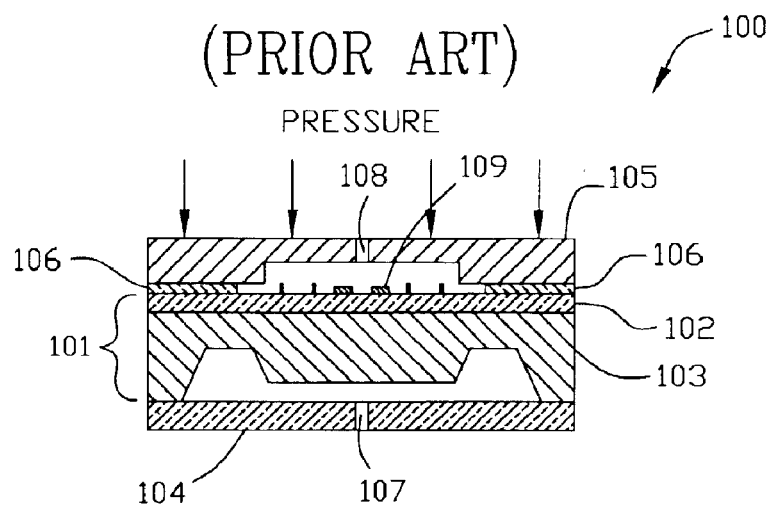
FIG. 1 is a cross-sectional view of the prior art illustrating glass frit securing the top cover to the sensor.
Figure 2:
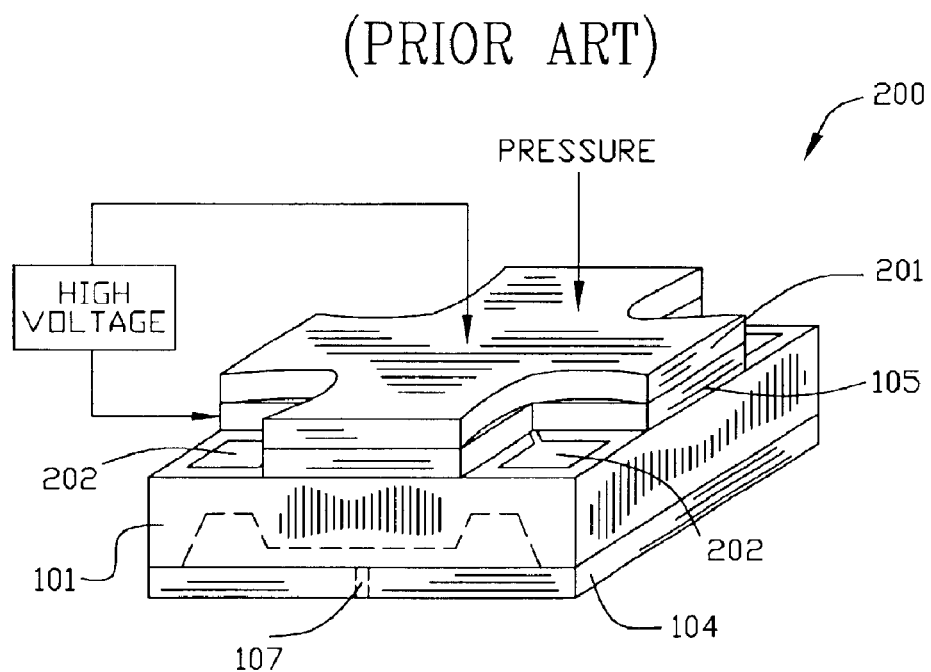
FIG. 2 is a perspective view of the prior art illustrating electrostatic bonding of the top cover to the sensor.
Figure 3:
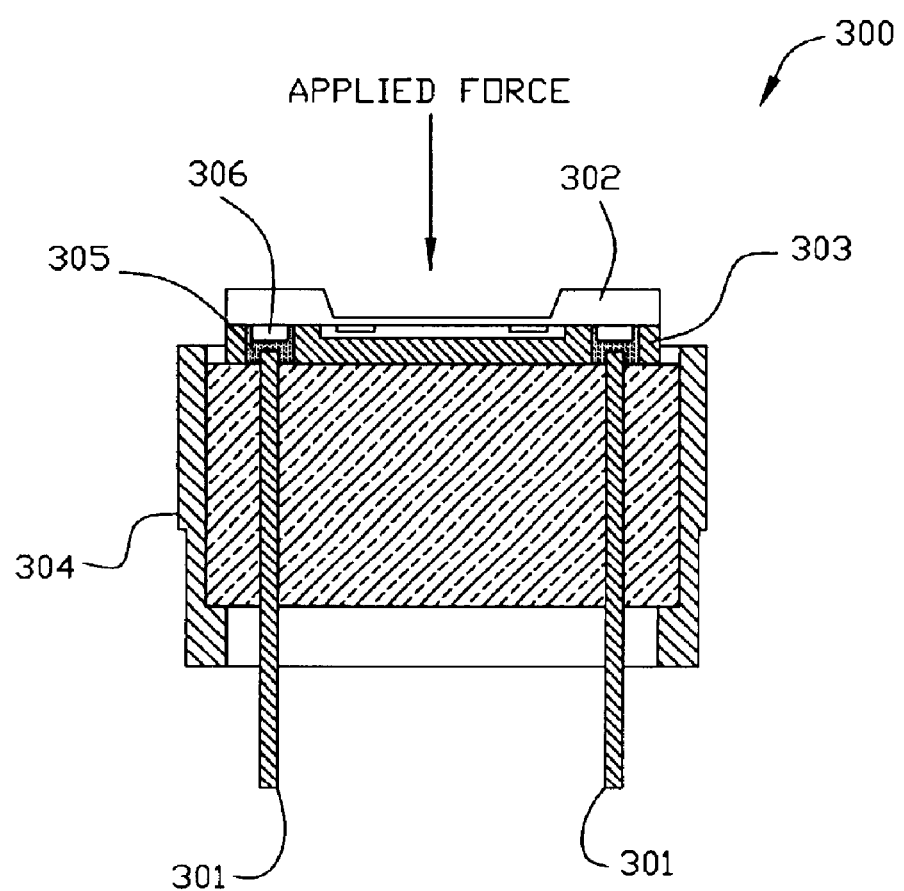
FIG. 3 is a cross-sectional view of the prior art illustrating the first substrate bonded to the second substrate by either glass frit or electrostatic bonding.

The direct chip attach (DCA) process disclosed herein eliminates the need for wirebond and the associated failure mechanisms at high temperature. In the prior art, gold wirebonding is used to make electrical connection from the sensor to pins. However, gold diffusivity into the ohmic contacts on the pads increases rapidly with temperature, which contributes to electrical and mechanical degradation at the bond interface. The instant DCA approach allows the flexibility of using platinum or other types of high temperature wires or pins 801 that do not readily diffuse at high temperature. It is desired that this top cover should also be of the same material as the bottom cover in order to maintain symmetry of the coefficient of thermal expansion (CTE). In the prior art, little consideration is given to package related thermally-induced stress in terms of its impact on the mechanical and ultimately electrical functionality and long-term reliability of the sensor. The existence of thermally-induced stress during thermal cycling is known to induce fatigue at several critical areas of the system such as fatigue at the wirebond/pad interface. For instance, in FIG. 3, the thermal expansion mismatch between the glass and the second substrate and the glass and the metal header creates unwanted stress and/or failure of the sensor.

Figure 7:
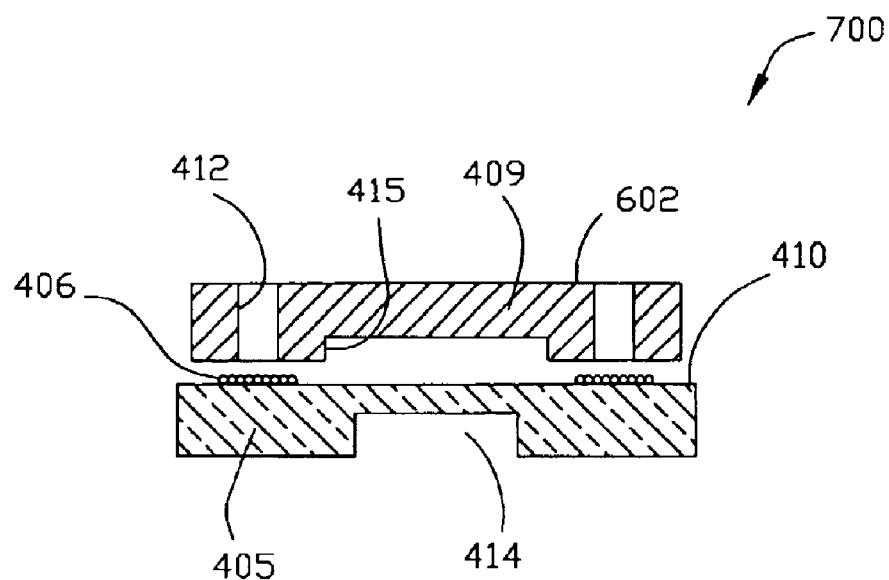
FIG. 7 is a cross-sectional view of an alternative embodiment similar to FIG. 6 without the bottom cover substrate but includes the contact pads.

Referring to FIG. 6, the centrally located recessed area 415 of the top cover 409 is a shallow cavity that will lie directly above the active moving part 603 of the sensor 405 below. Sensor 405 deflects above the diaphragm 414 and this is the active portion 603 of the sensor. Piezoresistors are not shown on or in sensor 405. The section outside this recessed area 415 will be in intimate contact with the corresponding sensor sections outside the active area as illustrated in FIGS. 6 and 7. Recessed area 415 allows the moving part of the sensor 405 adequate room to deflect and also protect the moving part from over-deflecting. The cavity volume (i.e. the recessed area 415) also acts to provide a reference pressure when hermetically sealed and used as an absolute pressure sensor or control of damping in an accelerometer as desired and as dictated and controlled at the time of glassing.

Referring to FIG. 5, the grid openings 502 on the sides of this top cover substrate 500 will be wider than the grid openings 402 (FIG. 4) of bottom cover substrate 400 so that peripheral sections 410 of the sensor 405 in each cell 407 are visible. That means the perimeter of the top cover 409 of the top substrate 500 is the smallest of the three components (top cover, sensor and cell 407). The top cover substrate 500 is placed over the bottom cover substrate 400 having sensors in each cell and aligned such that through holes 412 are placed over contact pads 406. High temperature glass paste is applied into the grid openings 502, 402 from the perimeter of each component. The glass paste will come in contact with the peripheral edges of the sensors 405, the bottom 400 and top cover 500 substrates. The glass is then cured at high temperatures greater than the anticipated operating temperature of the device.

As a result of the glass coming in contact with the periphery of the sensors 405, the bottom cover 400 and the top cover 500 substrates, a hermetic sealing of the volume cavity 415 in the over-pressure protection section is achieved.

A cross section of the three components (sensor 405, top cover 500 and bottom cover 400 substrates) are shown below in FIG. 6 to better illustrate the inter-relationship during the glass sealing process. FIG. 6 is a diagrammatic cross-sectional view of a single cell 600 of the array illustrating the housing or cell 407 of the bottom substrate or cover, a sensor 405 having contact pads 406, and a top cover 409 with a reference cavity 415 and bores 412 for receiving pins 801. FIG. 6 illustrates components of a single cell 600 of the array prior to bringing all the components in intimate contact with each other. Top cover 409 includes an area 602 proximate to through hole 412 about which conductive paste can be spread as described below. The conductive paste is dragged inside through hole 412 when pins 801 are inserted therein for engagement with contact pads 406.

Referring to FIGS. 6A, 7A, 10 and 11, it can be seen that the glassing section will come in contact with the three components enveloping them so as to provide the necessary hermetic sealing to create a reference cavity or, in the case of an accelerometer, damping cavity 415. It will be understood that the cells 407 may be any shape and that the sensors 405 must be similarly shaped but proportionally smaller than the cell 407 so that they will fit into the cells. Similarly, the top covers 409 must be similarly shaped but smaller than the sensors. The cells 407, sensors 405 and top covers 409 of the preferred embodiment are generally rectangularly shaped and are stacked upon each other leaving room about the area 408 between the sensor 405 and the wall 404 for glass to fill. Similarly, the lip 410 of the sensor 405 is left uncovered by the top 409 enabling space for the glass to hermetically seal and secure the top cover 409 to the sensor 405.

Figure 6A:
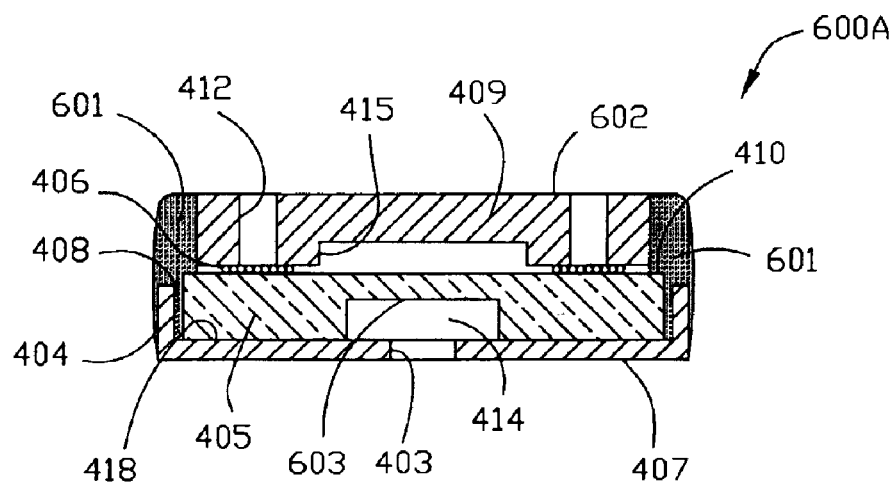
FIG. 6A is a diagrammatic cross-sectional view of a single cell of the array similar to FIG. 6 with the components sealed and secured together with glass.
Figure 6B:
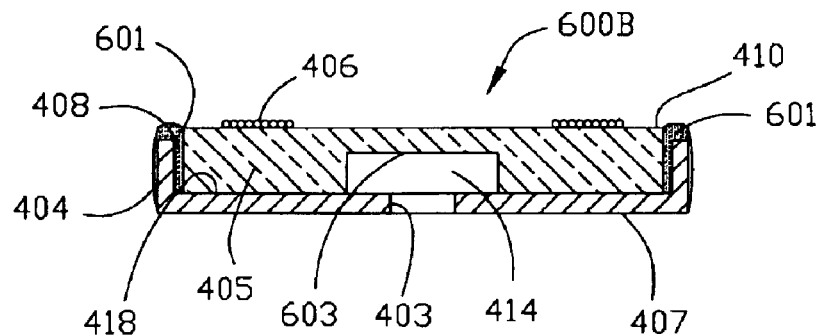
FIG. 6B is a diagrammatic cross-sectional view of a single cell of the array similar to FIG. 6 with just the housing and the sensor secured thereto including the contact pads.

FIG. 6A is a diagrammatic cross-sectional view 600A of a single cell 407 of the array similar to FIG. 6 with the components sealed and secured together with glass 601. FIG. 6B is a diagrammatic cross-sectional view 600B of a single cell of the array similar to FIG. 6 with just the housing 407 and the sensor 405 secured thereto.

Figure 7A:
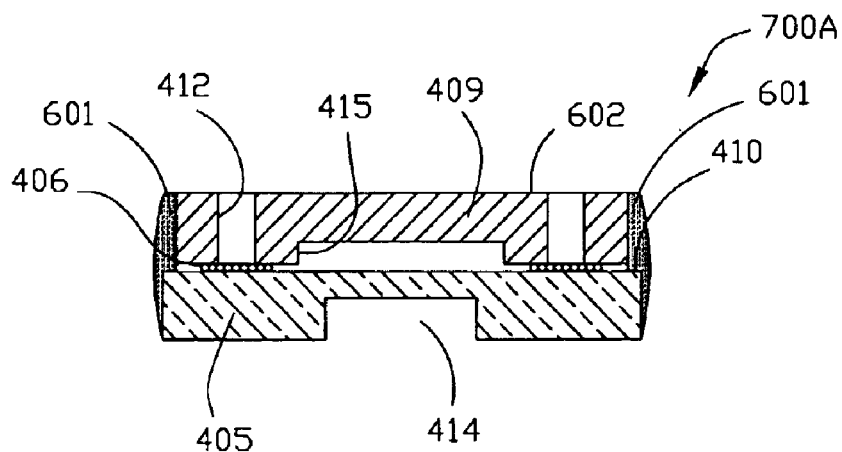
FIG. 7A is a cross-sectional view similar to FIG. 7 with the components sealed and secured together with glass.
Figure 8B:
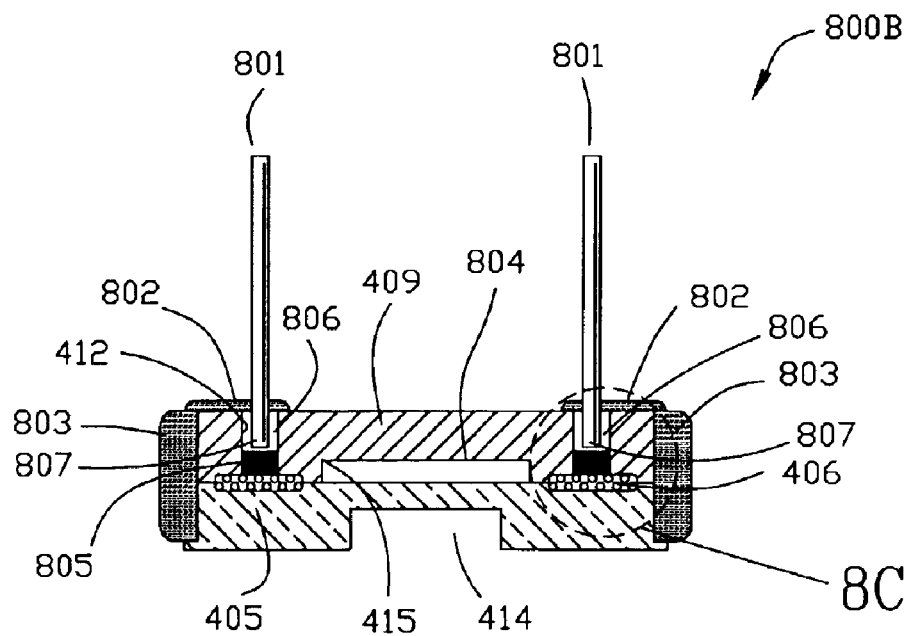
FIG. 8B is a cross-sectional view similar to FIG. 8 with the pins attached to nickel which partially fills through holes. Conductive paste secures the contact pins to the nickel. Next, glass paste is used to further secure the pins to the top cover to provide mechanical rigidity of the pins.
Figure 8A:
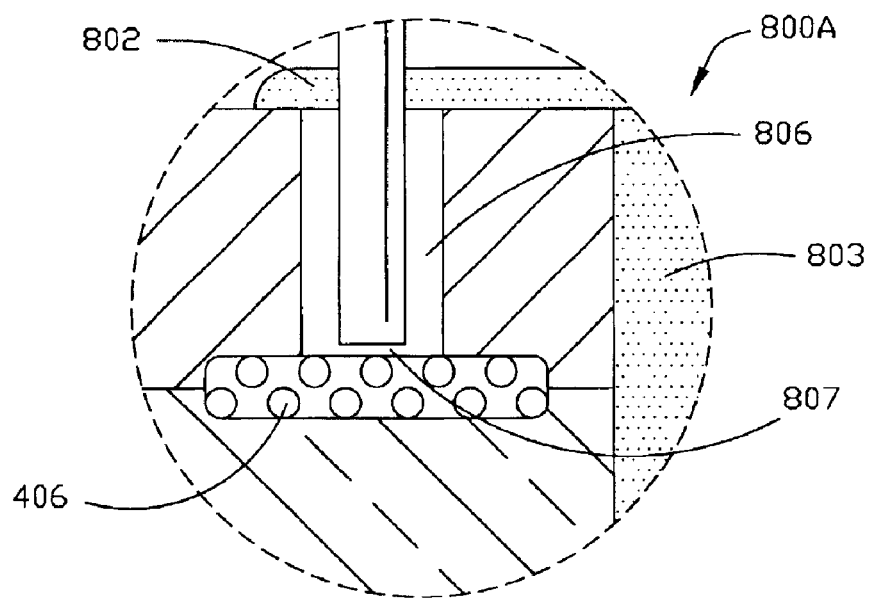
FIG. 8A is an enlargement of a portion of FIG. 8.

FIG. 7 is a cross-sectional view of an alternative embodiment 700 similar to FIG. 6 without the bottom cover substrate. Referring to FIG. 7, the bottom cover 418 has been eliminated and the top cover substrate 500 can be brought in direct contact with the sensors 405. The sensors 405 have been previously batch fabricated as taught in my copending patent application referred to above or as produced by another process. Referring to FIGS. 8, 8A and 8B, glass 803 seals and secures the top cover 409 and the boundary or walls 404 of each cell 407 of the sensor array so that hermetic sealing 803 is provided. FIG. 7A is a cross-sectional view 700A similar to FIG. 7 with the components sealed and secured together with glass 601.

In either embodiment, FIG. 6A or FIG. 7A, the now fully sandwiched and sealed sub-assemblies are then separated by using a conventional semiconductor dicing method with a saw blade. The next stage will be to insert the connecting pins 801 into the through holes 412.

Wire Connections

In either embodiment, FIG. 6A or FIG. 7A, similar wire attachment process applies. FIG. 8 is a cross-sectional view 800 illustrating pins 801 attached to contact pads 406 through through holes 412 of the top cover 409. The pins 801 are first attached to the pads 406 with conductive paste 806 used to secure them to the holes 412 and to the pad 406. Next, glass paste 802 is used to further secure the pins 801 to the top cover 409 to provide mechanical rigidity of the pins 801. FIG. 8A is an enlargement 800A of a portion of FIG. 8 illustrating the conductive paste 806 engaging one end 807 of the pin 801.

Referring to FIGS. 8 and 8A, one end 807 of the platinum pin 801 is dipped into a high temperature conductive paste 806 that cures at a temperature less than the softening point of the glass 803 used for sealing. Alternatively and/or additionally, conductive paste 806 may be spread at the entrance 602 to the through hole 412 of the top cover member 409. In this fashion, conductive paste 806 can be drawn into the through hole for securing the pin to the through hole 412. Pin 801 is then inserted into the pin hole 412 until it makes contact with the corresponding pad 406 on the sensor 405. Each pin 801 is processed similarly. A thin layer 807 of conductive paste may reside between the pins 801 and the contact pads 406.

Sub-assemblies illustrated in FIGS. 8, and 8B with the four pins 801 inserted therein are fired to high temperature, which facilitates the bonding of the pins 801 to the contact pads 406. The sub-assembly is cooled and then another round of glass 802 is applied to each pin 801, which is then fired to the glass curing temperature. This process offers additional strengthening of the wire connection to the pads 406, above and beyond securement with just the conductive paste. Reference numeral 804 indicates the volume of hermetically sealed reference cavity 415.

Figure 8C:
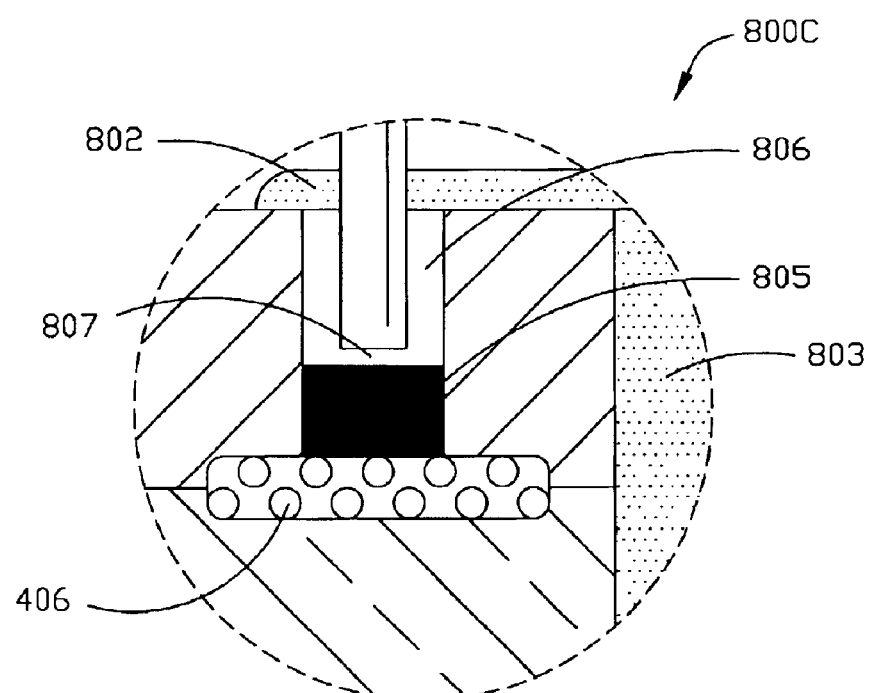
FIG. 8C is an enlargement of a portion of FIG. 8B.
Figure 8D:
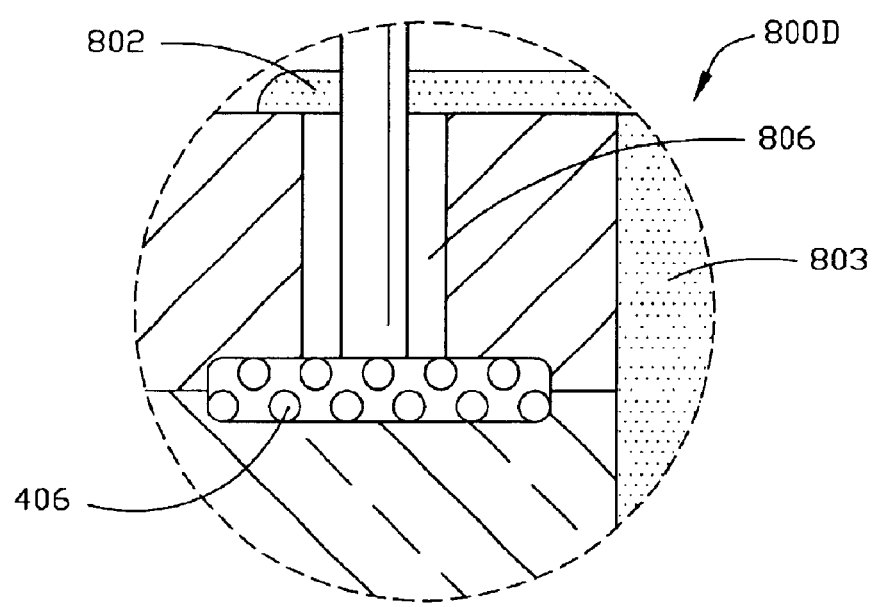
FIG. 8D is an enlargement similar to FIG. 8A illustrating the pin in contact with the contact pad 406.

FIG. 8B is a cross-sectional view 800B similar to FIG. 8 with the pins attached to nickel 805 which partially fills through holes 412. Nickel 805 may be inserted into through holes 412 so as to partially fill them and engage contact pads 406. Then, the pins 801 with conductive paste 806 thereon may be brought into engagement with the contact pads. Conductive paste secures the contact pins 801 to the nickel. A thin layer 807 of conductive paste may reside between the pins 801 and the nickel 805. FIG. 8C is an enlargement 800C of a portion of FIG. 8B. FIG. 8D is a view 800D of an enlargement similar to FIG. 8A illustrating the pin 801 in contact with the contact pad 406.

Electroplating methods can be used to plug the holes halfway with nickel, followed by pin attachment to the nickel as described above. The nickel foot pad 805 then makes contact to the sensor pads 406.

Final Packaging

Figure 9:
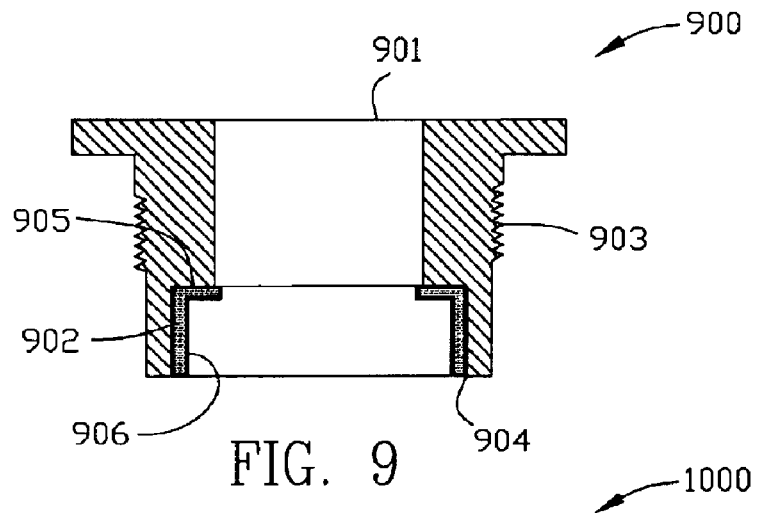
FIG. 9 is a cross-sectional view of a stainless steel screw housing brazed to a Kovar header at high temperature.

Several embodiments for performing the final packaging of the sub-assemblies are disclosed. FIG. 9 is a cross-sectional view 900 of a stainless steel screw housing 901 brazed to a Kovar header 902 at high temperature. Stainless steel screw housing 901 includes exterior threads 903 for attachment to a process connection.

Referring to FIG. 9, a Kovar header 902 is obtained with a hole drilled through the center as shown. The back end 905 of the Kovar header is then inserted into the nose of a stainless steel screw housing as shown. The stainless steel housing 901 and the Kovar header 902 are then brazed at a temperature that will allow complete fusion 904 of the surfaces in contact. This process is the preferred embodiment due to the high temperature required and also the ease it offers for the eventual attachment of the sensor sub-assembly. After that, a sensor sub-assembly such as that illustrated in FIG. 6A is inserted as shown in FIGS. 9 and 10.

Figure 10:
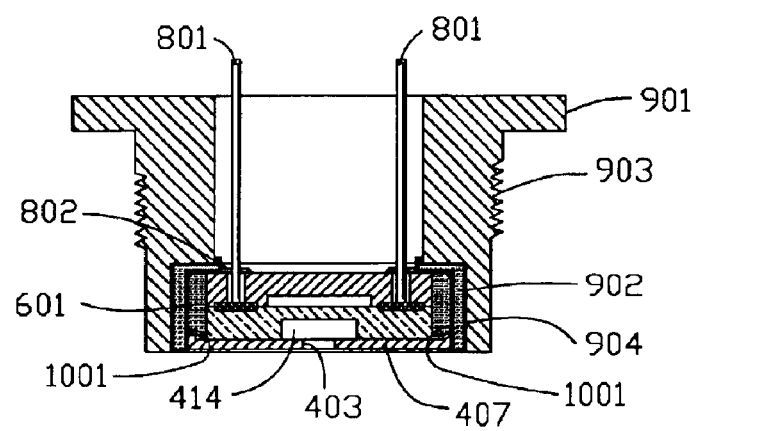
FIG. 10 is a cross-sectional view of FIG. 9 together with a sensor sub-assembly inserted into the Kovar header which was previously brazed to the stainless steel housing and affixed together prior to insertion within the stainless steel housing.

FIG. 10 is a cross-sectional view 1000 of the stainless steel-Kovar unit with a sensor sub-assembly inserted into it as shown. Prior to insertion, sealing glass 1001 is applied to the inner surface 906 of the Kovar header 902. The stainless steel-Kovar unit and the sensor sub-assembly are then fired at the glass cure temperature, which enables the bonding of the two units. Alternatively, the sensor sub-assemblies of FIG. 6A or FIG. 8B can be inserted into the Kovar header. Other designs within the spirit and the scope of the invention as disclosed and claimed may be inserted into a Kovar header.

Figure 11:
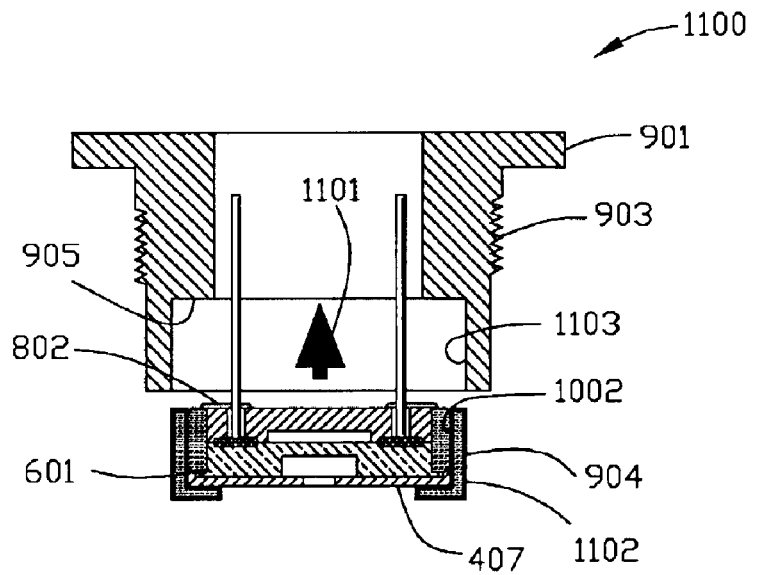
FIG. 11 is a cross-sectional view of a stainless steel screw housing with a brazed Kovar header and a sensor sub-assembly being inserted therein.

FIG. 11 is a cross-sectional view 1100 of a stainless steel-Kovar unit with a brazed Kovar header and sensor sub-assembly being inserted therein The sensor sub-assembly is attached to the Kovar using the process stated earlier before insertion into the stainless steel screw housing 901. Arrow 1101 represents the direction of insertion of the Kovar header and the sensor sub-assembly which has been secured to the header into the stainless steel housing by laser jet welding. Laser jet welding is localized welding and doesn't destroy the sensor. Surface 1102 of the header is laser welded to the surface 1103 of the stainless steel housing. It should be noted that the stainless steel housing could be of any shape and is not necessarily cylindrical as shown in FIGS. 9–11.

Figure 12:
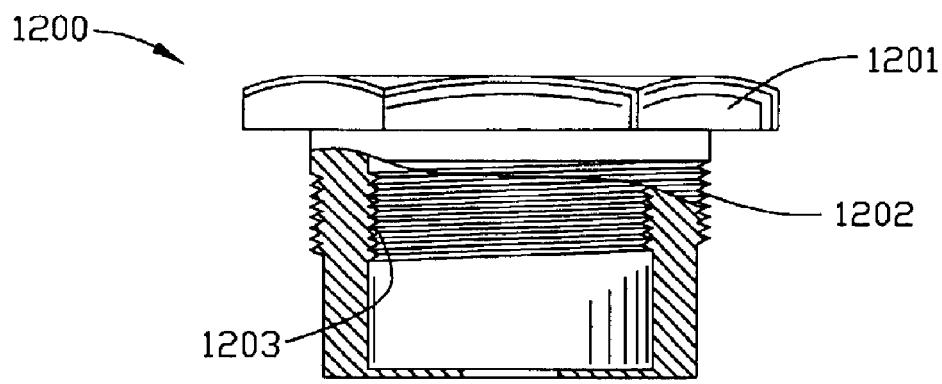
FIG. 12 is a cross-sectional view of a double-threaded stainless steel screw housing.

FIG. 12 is a cross-sectional view 1200 of a double-threaded stainless steel screw housing. Stainless steel screw housing 1201 is designed so that it has inner 1203 and outer threading 1202 as shown. It is known in the art that most glass paste materials do not adhere well to stainless steel. However, this problem is significantly minimized by utilizing geometry to overcome the adhesion problem between glass and stainless steel, which allows the elimination of Kovar, thereby simplifying the process further.

Figure 13:
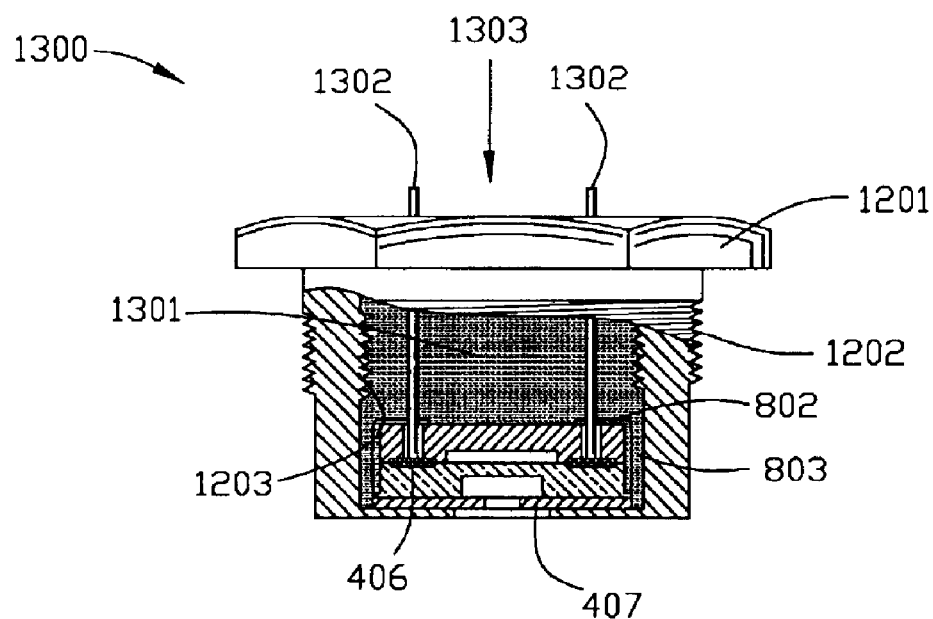
FIG. 13 is a cross-sectional view of a double-threaded stainless steel screw housing together with a sensor sub-assembly inserted therein together with a glass seal.

The sensor sub-assembly with the pins 1302 is inserted as shown by the arrow 1303 into the stainless steel screw housing 1201 and dropped into the stainless case as shown in FIG. 13. FIG. 13 is a cross-sectional view 1300 of a double-threaded stainless steel screw housing 1201 together with the sensor sub-assembly inserted therein encased by a glass seal 1301. Sealing glass 1301 is applied into the case and cured. Since the glass flows conformally with the inner threading 1203 of the stainless steel case before curing, it will retain the molded shape when cooled. This process provides intimate contact between glass 1301 and stainless 1201 but does not require that the two surfaces be chemically bonded. The degree of leakage will strongly depend on the number of threads and height of the threaded section. More threads and increased height will provide a tortuous path for gases which will attempt to leak from the sensor sub-assembly where the pressure is sensed. Those skilled in the art will readily recognize that changes to FIGS. 12 and 13 may be made such that the sensor sub-assembly may be encased by a larger and longer stainless steel housing such that the sensor would be encased by more glass. Further, those skilled in the art will readily recognize that more and different thread patterns may be used from that shown in FIGS. 12 and 13. For instance, a greater number of inner threads 1203 may be utilized or they may be less coarse so as to create a more tortuous path so as to prohibit the escape of process gasses from the final packaging. It is recommended that a glass seal length 10 times the thickness of the sensor sub-assembly be used.

Figure 14:
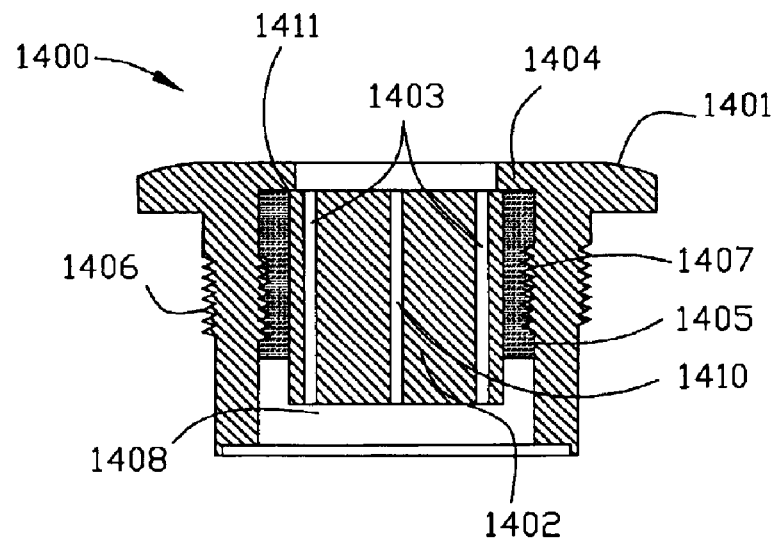
FIG. 14 is a cross-sectional view of a double-threaded stainless steel screw housing with a ceramic tube placed therein. Braze material is placed between the ceramic tube and interior threads of the stainless steel screw housing.
Figure 14A:
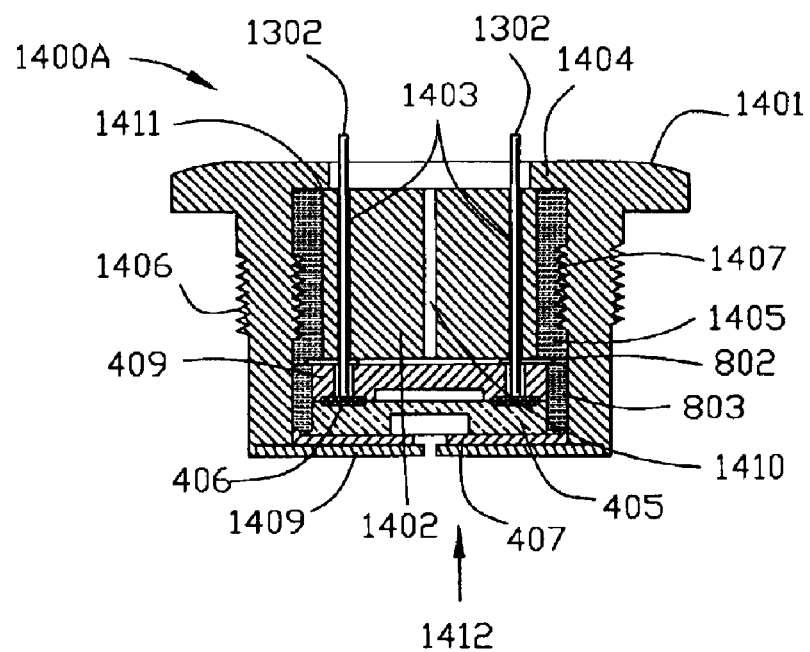
FIG. 14A is a cross-sectional view similar to that of FIG. 14 with a sensor sub-assembly having been inserted prior to insertion of the ceramic tube and blow-out stopper. The blow-out stopper is machined in the stainless steel housing.

FIG. 14 is a cross-sectional view 1400 of a double-threaded stainless steel screw housing 1401 with a ceramic tube 1402 placed therein. Braze material 1405 is placed between the ceramic tube 1402 and interior threads 1407 of the stainless steel screw housing. FIG. 14A is a cross-sectional view 1400A similar to that of FIG. 14 with a sensor sub-assembly having been inserted into the stainless steel housing 1401 as shown after sliding the pins through ceramic tube 1402. The blow out stopper of at least 100 mils is machined out of stainless steel housing. Ceramic tube 1402 includes four passageways 1403 for wires of pins 1302/801 and another passageway 1410 for a thermocouple lead. The ceramic tube may be made of aluminum nitride or its equivalent, Volume 1408 in FIG. 14 simply indicates the place the sensor sub-assembly occupies. Bottom protection shield 1409 protects the diaphragm of the sensor sub-assembly from engine particulates. A sensor sub-assembly without a bottom housing 407 may be used in the structure of FIG. 14. Similarly, a sensor sub-assembly without a top cover may be used in the structure of FIG. 14. And, a sensor alone may be used in the structure of FIG. 14. Reference numeral 1412 indicates the direction of the insertion of the ceramic tube and sensor in the housing.

Referring to FIGS. 14 and 14A, the stainless steel housing 1401 is fabricated as shown. It has both outer 1406 and inner threading 1407. A ceramic tube, with holes equal to the number of sensor pins 1302/801 and one extra hole 1410 for a thermocouple, is inserted into the stainless steel as shown. A high temperature brazing material 1405 is applied in the gap between the ceramic and stainless steel so that it is conformal to the inner thread 1403 of the stainless steel tube. It is ensured that the ceramic tube 1402 touches or engages 1411 the blowout stopper 1404 preventing the ceramic tube from being blown out under pressure should it detach from the stainless steel. The ceramic tube is then brazed to the stainless steel with a high temperature braze material 1405 that brazes at temperature greater than the operating temperature of the device. Pins 1302 of the sensor sub assembly are then inserted into the tube holes 1403. The section where the ceramic tube intimately contacts the sensor sub-assembly is sealed with high temperature glass. After leak checking, a protection shield 1409 is then attached to protect the diaphragm from being hit by particles in the engine. The protection or particulate shield may be eliminated if the sensor sub-assembly includes the bottom member 407.

Figure 15:
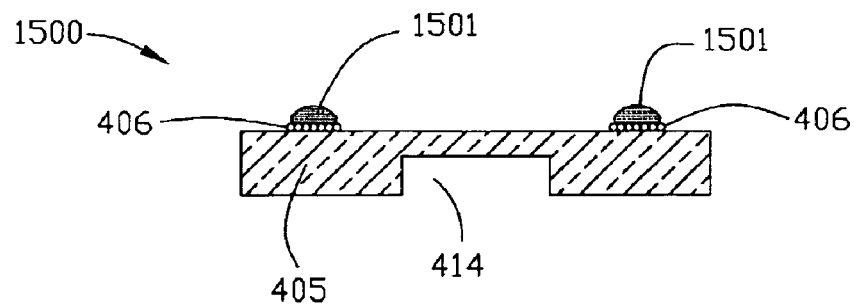
FIG. 15 is a cross-sectional view of a sensor illustrating bump or stud metal affixed to contact pads on the sensor.

FIG. 15 is a cross-sectional view 1500 of a sensor illustrating bump 1501 or stud metal affixed to contact pads 406 on the sensor.

Referring to FIG. 15, additional metallization "bump" 1501 is placed on each of the ohmic contact pads 406 is shown. The bump 1501 is about 5 microns out of plane of the main bonding pads 406. This is done before dicing the sensors into single chips. The bump serves important functions. It facilitates connection between the sensor ohmic contact 406 and the pins to be eventually attached it. Bumps also eliminate the need for a top cover substrate 409 such as is shown in FIG. 6. Tubes 1402 made from ceramic such as alumina or aluminum nitride like the one illustrated in FIG. 14 commonly known in the art as ceramic tubes are obtained with through holes equal to the number of contact pads 406 on the sensors, including one for thermocouple insertion.

Figure 16:
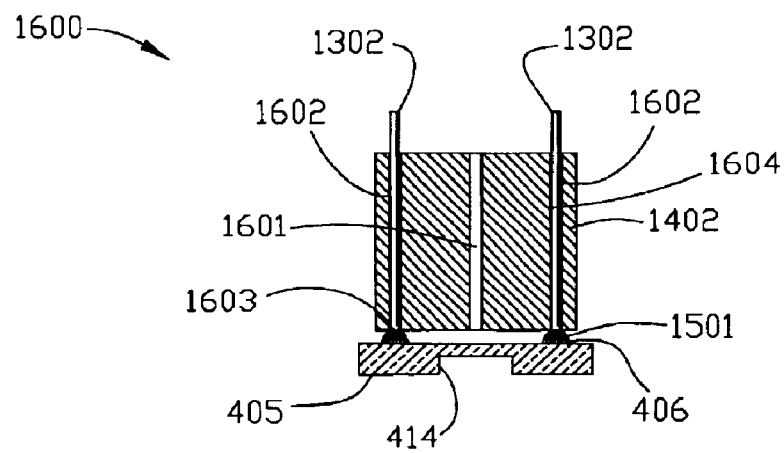
FIG. 16 is a cross-sectional view of a ceramic tube having pins secured therein. The pins engage the sensor and a bump or stud metal affixed to contact pads on the sensor.

FIG. 16 is a cross-sectional view 1600 of a ceramic tube 1402 having pins 1302 secured therein. Pins 1302 engage the sensor and a bump 1501 or stud metal affixed to contact pads 406 on the sensor 405. Through holes 1602 corresponding to the contact pads 406 are pre-arranged to align directly on to the top of the corresponding bond pads. Conductive wires 1302 such as nickel or platinum are inserted into the through holes that correspond to the bond pads. Attachment to the bump is secured with a high temperature conductive paste 1603. Attachment of the wires to the through holes 1602 is accomplished with either conductive or non conductive paste 1604 by the methods described above. Thermocouple hole 1601 receives a thermocouple if one is desired.

Attachment of the wires to the ceramic tube is accomplished before attachment of the wires to the sensor chip 405. The ceramic tube 1402 and the wires inside 1302 are first fired at temperatures above the anticipated operating temperature of the device. Since there is no sensor chip that can be damaged by the high temperature, this process allows the package unit to be ruggedly secured.

The face of the ceramic is then smoothened so that the exposed sections of the wires are planar with the surface of the ceramic. It is then attached to the conductive bumps 1501 on the sensor 405 as shown in FIG. 16 and fired at 650° C. to attach the bump to the pins. Conductive paste 1603 may optionally be used for this process.

Figure 17:
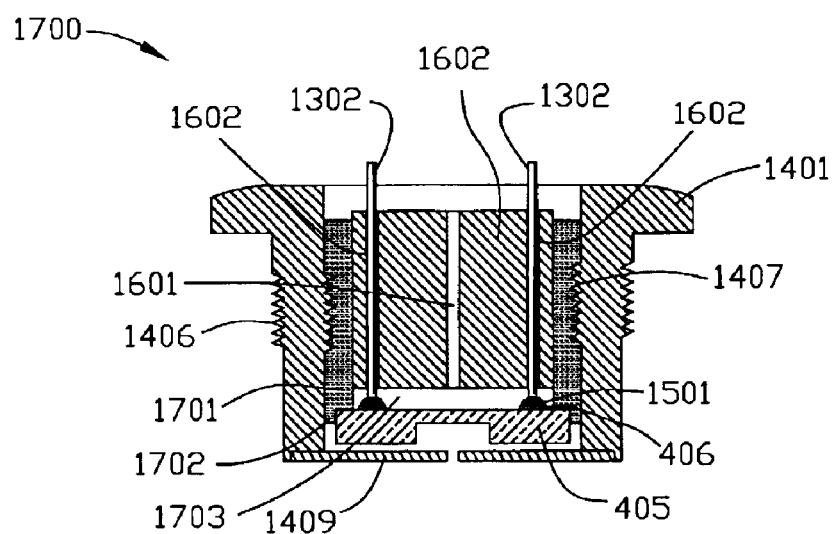
FIG. 17 is a cross-sectional view similar to that of FIG. 14 together with a sensor sub-assembly inserted therein.

The ceramic tube 1402 with the sensor 405 attached to it is then inserted into a double-threaded stainless steel screw housing similar to that shown in FIG. 12. FIG. 17 is a cross-sectional view 1700 similar to that of FIG. 14 together with a sensor sub-assembly inserted therein. The inner portion of the screw housing has been pre-wet with high temperature glass paste 1701 before inserting the unit of FIG. 16. More glass 1702 is then applied to the sensor 405 head area so that a reference cavity 1703 is formed. The entire package is then fired at 800° C. for 30 minutes in nitrogen ambient. The final package looks like the one shown in FIG. 17. This package is re-workable in that the sensor can be removed and replaced. This can be done by removing the section of glass that is connected to the sensor. After replacement, it is initially fired at low temperature to attach the bump to the pins. Glass 1702 is attached and the package is fired again at 800° C.

Figure 18:
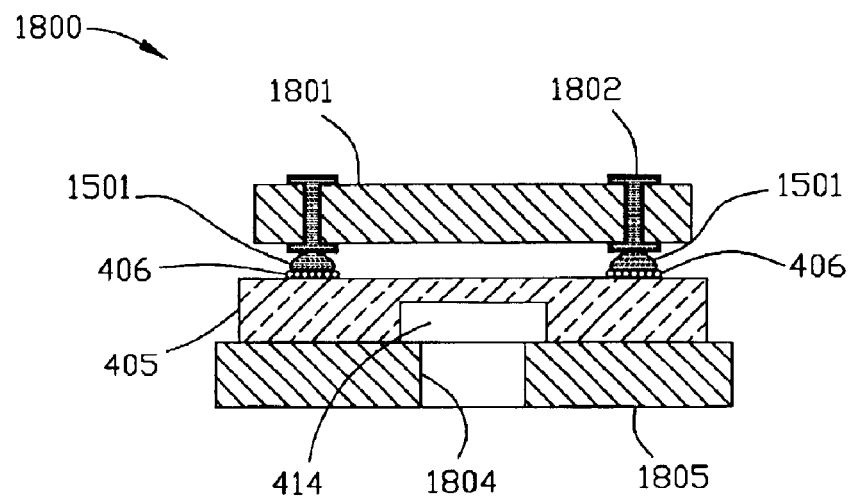
FIG. 18 is an alternative embodiment of the sensor in combination with a top cover having a transconnect.
Figure 19:
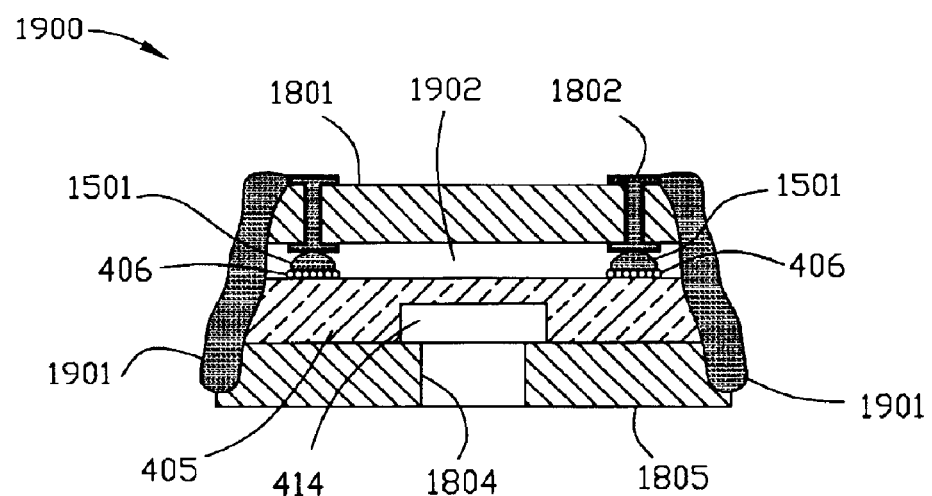
FIG. 19 is similar to FIG. 18 and illustrates the securement of the top cover, sensor and bottom substrate with glass.

FIG. 18 is an alternative embodiment 1800 of the sensor 405 in combination with an aluminum nitride top cover 1801 having a nickel transconnect 1802. FIG. 19 is similar to FIG. 18 and illustrates 1900 the securement of the aluminum nitride top cover 1801, sensor 405 and aluminum nitride bottom substrate 1805 with glass 1901. Bottom substrate 1805 includes an aperture 1804 therein.

To batch fabricate the package, the through holes in the aluminum nitride top cover are filled with electroplated nickel 1802 such that the nickel footpads will come to rest on the sensor pads as shown in FIGS. 18 and 19. After bump-attachment between the top cover and the sensor, the bottom cover is then brought in contact with the bottom part of the sensor. The entire unit is then glassed 1901 as illustrated in FIG. 19 by the process described in connection with FIGS. 4 and 5 above. Reference cavity 1902 is formed by glassing 1901 the sensor sub-assembly as illustrated in FIG. 19. The sensor sub-assembly of FIG. 19 is then inserted into a sensor housing which has been described herein.

Figure 20:
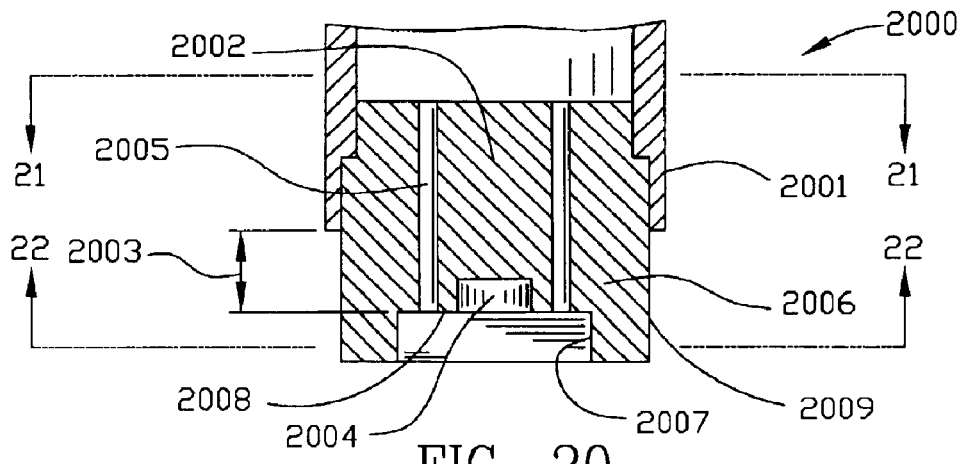
FIG. 20 is a cross-sectional view of an aluminum nitride ceramic tube having bores therethrough inserted into a long stainless steel tube to thermalmechanically decouple the device from the tube.
Figure 21:
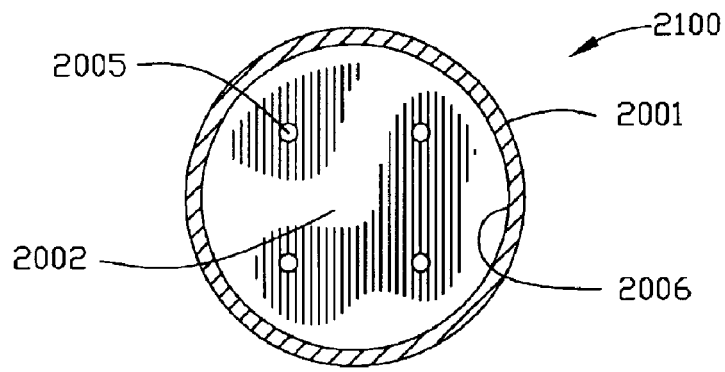
FIG. 21 is a cross-sectional view along the lines 21—21 of FIG. 20.
Figure 22:
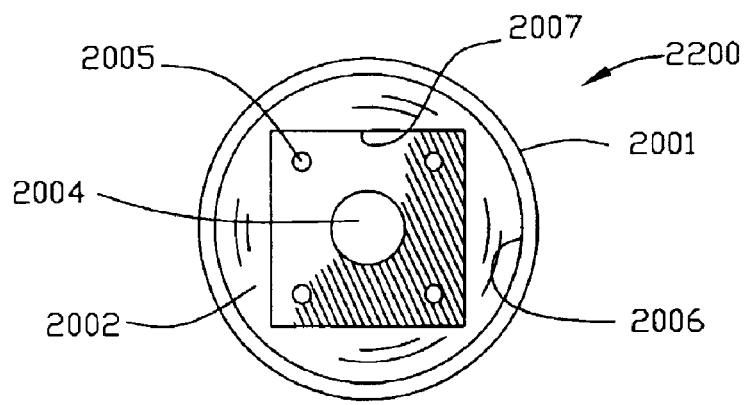
FIG. 22 is a cross-sectional view along the lines 22—22 of FIG. 20.

FIG. 20 is a cross-sectional view 2000 of an aluminum nitride ceramic tube 2002 having bores 2005 therethrough inserted into a long stainless steel tube 2001 to thermally decouple a sensor sub-assembly having a sensor chip and a bottom cover from the tube. FIG. 21 is a cross-sectional view 2100 along the lines 21—21 of FIG. 20. FIG. 22 is a cross-sectional view 2200 along the lines 22—22 of FIG. 20. The package embodiment of FIGS. 20–22 ensures that minimum glass is used in the sealing process. The housing is a stainless steel tube 2001. Inserted into the tube is the aluminum nitride prefabricated header 2006. The insertion is made such that the section of the header that will house the sensor 405 extends out of the stainless steel tube far enough so that any thermomechanical effect of the stainless steel 2001 on the aluminum nitride header 2002 does not travel far enough to have an effect on the sensor. As a result, thermomechanical stress decoupling between the sensor and the stainless steel is accomplished. Since the coefficient of thermal expansion of the silicon carbide sensor and the aluminum nitride header are practically the same, very little stress is induced on the sensor by the package components.

The outer surface 2009 of the aluminum nitride header 2002 is coated with a metallic material such as nickel. The nickel will be use for laser welding or brazing to the stainless steel to prevent any leak between the stainless steel and the aluminum nitride.

Reference numeral 2005 indicates through holes in the aluminum nitride header. Reference numeral 2004 represents the volume of the reference cavity which will formed upon the insertion of a sensor in sensor cavity 2007 and glassing the sensor sub-assembly to the header. Reference numeral 2003 represents the length of the extension of the header 2002 outside of the stainless steel tube 2001.

Conductive paste 2008 is applied around the four holes located at the cavity base of the aluminum nitride header 2002. Connecting pins are then inserted from the cavity side of the header and extended so that the conductive paste wets them.

When fired at high temperature, the pins will adhere to the now cured and hardened paste. The hardened paste will also adhere strongly to the aluminum nitride, thereby providing a strong mechanical anchor to the pins.

A smaller amount of conductive paste is reapplied on the surfaces of the hardened paste. The sensor is then inserted into the receiving cavity 2007 in the header so that the sensor pads are aligned to the conductive paste and brought in intimate contact. Another high temperature curing is performed to allow the paste to bond to the sensor pads, thereby establishing electrical communication between the sensor, pins, and outside circuitry.

High temperature glass fills the small gap between the sensor sub-assembly having only a sensor 405 and a bottom cover 407 or just a sensor 405 and the inner wall of the cavity 2007 of the aluminum nitride header. The glass is then fired at high temperature so that it bonds to the aluminum nitride and the sensor, thereby sealing that section and preventing leakage. As a result of these processes, namely, glass curing and conductive paste curing, an air bubble is trapped inside the reference cavity. This acts as reference pressure for the transducer.

Although this invention has been described by way of example and with particularity and specificity, those skilled in the art will recognize that many changes and modifications may be made without departing from the spirit and scope of the invention defined by the claims which follow hereinbelow.

I claim:

1. A method of bulk packaging sensors, comprising the steps of:
   placing a bottom substrate having an array of sensor housings in a holding device to receive sensors, each of said sensor housings having an aperture therein;
   inserting a sensor having contact pads in each housing of said bottom substrate;
   and, placing a top substrate having an array of covers onto each respective sensor.

2. A method of bulk packaging sensors as claimed in claim 1 wherein said array of covers include joining portions and wherein each of said joining portions include undercut portions, further comprising the steps of:
   sealing the perimeter of each said housing, sensor, and cover.

3. A method of bulk packaging sensors as claimed in claim 2 wherein said step of sealing forms a hermetic seal.

4. A method of bulk packaging sensors as claimed in claim 3 wherein said step of sealing is a glass seal and wherein said glass occupies said undercut portions of said joining portions.

5. A method of bulk packaging sensors as claimed in claim 2 further comprising the steps of:
   cutting said sensors into individual packages.

6. A method of bulk packaging sensors as claimed in claim 3 further comprising the steps of:
   cutting said sensors into individual packages.

7. A method of bulk packaging sensors as claimed in claim 4 further comprising the steps of:
   cutting said sensors into individual packages.

8. A method of bulk packaging sensors as claimed in claim 1 wherein said housings are substantially square shaped and include a substantially square perimeter wall, said wall having an inside portion and an outside portion; each sensor includes a substantially square perimeter and said perimeter of each sensor being shorter in length than said square perimeter wall of each said housing; and, each top cover having a substantially square perimeter shorter than said square of each respective sensor.

9. A method of bulk packaging sensors as claimed in claim 8 wherein each of said top covers is stacked upon a respective sensor and each said sensor is inserted in a respective housing of said bottom substrate.

10. A plurality of packaged sensors comprising:
a bottom substrate having a plurality of housings;
each of said housings has a perimeter;
a plurality of sensors each of which resides in a respective housing;
each of said sensors has a perimeter;
a top substrate having a plurality of covers;
each of said covers has a perimeter; and,
said sensors being sandwiched together between said housings and said covers with the perimeters of each sensor, housing and cover sealed by glass.

11. A plurality of packaged sensors as claimed in claim 10 wherein each housing includes a recess and each sensor has a corresponding shape such that each sensor fits within said recess of each respective housing; and, wherein, each cover has a shape which corresponds to the shape of said sensor such that when said cover is placed atop said sensor the perimeter of said sensor is not covered.

12. A plurality of packaged sensors as claimed in claim 10 wherein said housings, sensors, and top covers are made from the group selected of silicon carbide and aluminum nitride.

13. A plurality of packaged sensors as claimed in claim 10 wherein said housings are arrayed in a first array and affixed to said first array by a plurality of first joining portions, said first joining portions separating said housings such that each said housing is spaced apart from the adjacent housing creating first gaps therebetween, and said top covers are arrayed in a second array and are affixed to said second array by a plurality of second joining portions, said second joining portions separating said covers such that each said cover is spaced apart from the adjacent cover creating second gaps therebetween, said second joining portions each include undercut sections, and, said second gaps being larger than said first gaps, said gaps and said undercut sections of said second joining portions enabling complete glassing of said top covers, said sensors and said housings.

14. A plurality of packaged sensors comprising:
a plurality of housings defined by walls;
a plurality of sensors each having perimeters which fit within said walls of said housings;
a plurality of top covers residing on top of said plurality of sensors such that each of said top covers resides on top of a respective sensor, each of said top covers having a shorter perimeter than its respective sensor, each said top cover has the same shape but is proportionally smaller than its respective sensor such that when said covers are mounted on top said each respective sensors said perimeters of said sensors are not covered.

15. A plurality of packaged sensors as claimed in claim 14 in combination with glass securing said top covers, sensors and housings together.

16. A plurality of packaged sensors as claimed in claim 15 wherein each of said sensors includes a plurality of contact pads and each said top covers includes a plurality of bores therethrough in combination with a plurality of pins which extend through said bores of said top covers and engage said plurality of contact pads.

17. A plurality of packaged sensors as claimed in claim 16 in combination with conductive paste residing in said bores in said top covers for securing said pins to said top covers and said contact pads.

18. A plurality of packaged sensors as claimed in claim 17 in combination with glass securing said pins to said top covers.

19. A plurality of packaged sensors as claimed in claim 18 wherein said pins are selected from the group of platinum, gold, nickel, or alloys of refractory metals.

20. A plurality of packaged sensors as claimed in claim 18 wherein said top covers include a recess for over-pressure protection.

21. A plurality of packaged sensors as claimed in claim 18 wherein said sensors include diaphragms.

22. A plurality of packaged sensors as claimed in claim 18 wherein said sensors are accelerometers.

23. A plurality of packaged sensors as claimed in claim 18 wherein said sensors are a combination of pressure sensors and accelerometers.

24. A method of direct contact attachment of a pin to a contact pad on a sensor, said sensor covered with a top cover having a through hole aligned with said contact pad, said top cover having a periphery, said sensor having a periphery, and, glass binding and sealing said periphery of said top cover and said periphery of said sensor together, comprising the steps of:
dipping one end of the pin into a high temperature conductive paste that cures at a temperature less than the softening point of said glass used for sealing;
inserting said pin coated with conductive paste until it engages said contact pad;
firing said assembly to a temperature to cure said conductive paste;
cooling said assembly;
applying glass to said pin and said top cover to secure said pin to said cover; and,
firing said assembly to the glass curing temperature.

25. A method of direct contact attachment as claimed in claim 24 comprising the additional steps of:
filling said through hole partially with nickel before dipping said pin in said conductive paste and inserting said pin in said through hole such that said pin engages said nickel.

26. A method of direct contact attachment as claimed in claim 24 wherein a plurality of pins are attached to a plurality of contact pads.

27. A method of direct contact attachment as claimed in claim 26 comprising the additional steps of:
filling said through holes partially with nickel before dipping said pins in said conductive paste and inserting said pins in said through hole and engaging said contact pads.

28. A glass-sealed sensor manufactured by the process of claim 27.

29. A glass-sealed sensor manufactured by the process of claim 26.

30. A packaged sensor sub-assembly comprising:
a bottom housing;
said sensor having contact pads and a perimeter, said sensor residing in said bottom housing;
a top cover having through holes therethrough, said through holes being aligned with said contact pads of said sensor;
pins;

conductive paste;

said pins residing in said through holes and engaging said contact pads of said sensors;

said conductive paste securing said pins to said through holes;

glass securing said top cover, sensor, and bottom housing together; and, glass securing said pins to said top cover.

31. A packaged sensor sub-assembly as claimed in claim 30 wherein said through holes of said top cover are partially filled with nickel such that said nickel engages said contact pads of said sensor and said nickel engages said pins.

32. A packaged sensor sub-assembly as claimed in claim 31 wherein said pins are selected from the group of gold, platinum or nickel.

33. A packaged sensor sub-assembly as claimed in claim 30 glassed to a Kovar header fused to a stainless steel housing.

34. A packaged sensor sub-assembly comprising:

a sensor having contact pads and a perimeter;

a top cover having through holes therethrough, said through holes being aligned with said contact pads of said sensor;

pins;

conductive paste;

said pins residing in said through holes and engaging said contact pads of said sensors;

said conductive paste securing said pins to said through holes;

glass securing said top cover and sensor together; and, glass securing said pins to said top cover.

35. A packaged sensor sub-assembly as claimed in claim 34 glassed to a Kovar header fused to a stainless steel housing.

36. A packaged sensor sub-assembly as claimed in claim 34 wherein said through holes of said top cover are partially filled with nickel such that said nickel engages said contact pads of said sensor and said nickel engages said pins.

37. A packaged sensor sub-assembly as claimed in claim 36 wherein said pins are selected from the group of gold, platinum or nickel.

38. A packaged sensor sub-assembly as claimed in claim 34 in combination with a sensor sub-assembly housing:

said sensor sub-assembly housing comprising a stainless steel housing having an interior and an exterior, said interior includes threads thereon, a ceramic tube resides in said interior of said stainless steel housing, brazing resides intermediate said interior threads of said stainless steel housing and said ceramic tube, and, said brazing secures said ceramic tube and said stainless steel housing together upon heating said brazing; and, said sensor sub-assembly being secured to said stainless steel housing and said ceramic tube by glass creating a reference cavity.

39. A packaged sensor sub-assembly housing in combination with a sensor sub-assembly housing as claimed in claim 38 further comprising metal bumps on said contact pads.

40. A sensor sub-assembly as claimed in claim 34 further comprising metal bumps on said contact pads.

41. A method for packaging a sensor sub-assembly, said sensor sub-assembly comprising a bottom housing, said sensor having contact pads and a perimeter, said sensor residing in said bottom housing, a top cover having through holes therethrough, said through holes being aligned with said contact pads of said sensor, pins, conductive paste, said pins residing in said through holes and engaging said contact pads of said sensors, said conductive paste securing said pins to said through holes, glass securing and sealing said top cover, sensor, and bottom housing together, and, glass securing said pins to said top cover, comprising the steps of:

attaching a Kovar header to a stainless steel housing;

inserting said sensor sub-assembly into said Kovar header, and, glassing said sensor sub-assembly to said Kovar header.

42. A method for packaging a sensor as claimed in claim 41 wherein the steps of inserting said sensor sub-assembly into a Kovar header and glassing said sensor sub-assembly to said Kovar header are performed before said step of attaching said Kovar header to said stainless steel housing.

43. A method for packaging a sensor sub-assembly, said sensor sub-assembly comprising a sensor having contact pads and a perimeter, said sensor residing in said bottom housing, a top cover having through holes therethrough, said through holes being aligned with said contact pads of said sensor, pins, conductive paste, said pins residing in said through holes and engaging said contact pads of said sensors, said conductive paste securing said pins to said through holes, glass securing said top cover and sensor together, and, glass securing said pins to said top cover, comprising the steps of:

inserting said sensor sub-assembly into a stainless steel housing having threads on the interior of said housing; and, sealing said threads, said sensor sub-assembly and said pins within said housing.

44. A method for packaging a sub-assembly as claimed in claim 43 wherein said step of sealing said threads, said sub-assembly and said pins within said housing is a glass seal.

45. A method for packaging a sub-assembly as claimed in claim 43 wherein said glass seal length is at least 10 times the thickness of said sub-assembly.

46. A method for packaging a sub-assembly as claimed in claim 43 wherein said interior threads include at least 5 ribs.

47. A sensor sub-assembly in combination with a stainless steel housing having an interior and an exterior, said interior includes threads thereon, comprising a sensor having contact pads and a perimeter, said sensor residing in said bottom housing, a top cover having through holes therethrough, said through holes being aligned with said contact pads of said sensor, pins, conductive paste, said pins residing in said through holes and engaging said contact pads of said sensors, said conductive paste securing said pins to said through holes and to said contact pads, glass securing said top cover and sensor together, and, glass securing said pins to said top cover in combination with a stainless steel housing having an interior and an exterior, sealing glass residing in said interior of said of said stainless steel housing seals said threads, said sensor sub-assembly and said pins within said housing.

48. A sensor sub-assembly in combination with a stainless steel housing having an interior and an exterior, said interior includes threads thereon, as claimed in claim 47 wherein said glass seal length is at least 10 times the thickness of said sub-assembly.

49. A sensor sub-assembly in combination with a stainless steel housing having an interior and an exterior, said interior includes threads thereon, as claimed in claim 48 wherein said stainless steel housing further includes threads on the exterior of said housing.

50. A sensor sub-assembly housing comprising a stainless steel housing having an interior and an exterior, said interior includes threads thereon, a ceramic tube resides in said interior of said stainless steel housing, brazing resides intermediate said interior threads of said stainless steel housing and said ceramic tube, and, said brazing secures said ceramic tube and said stainless steel housing together upon heating said brazing.

51. A sensor sub-assembly housing as claimed in claim 50 wherein said ceramic tube has first and second ends and said first end is smooth.

52. A sensor sub-assembly housing as claimed in claim 50 further comprising a blow-out stopper.

53. A sensor sub-assembly housing as claimed in claim 50 further comprising a particulate shield.

54. A sensor sub-assembly housing as claimed in claim 50 further comprising a through hole in said ceramic tube.

55. A sensor sub-assembly housing as claimed in claim 54 further comprising a thermocouple which passes through said ceramic tube in one of said through holes.

56. A packaged sensor sub-assembly comprising:
a bottom housing;
said sensor having contact pads and a perimeter, metal bumps formed on said contact pads, said sensor residing in said bottom housing;
a top cover having through holes therethrough, said through holes being aligned with said contact pads of said sensor;
said through holes being filled with nickel so as to form a transconnect;
said transconnect engaging said bumps;
conductive paste; and,
glass securing said top cover, sensor, transconnect and bottom housing together forming a reference cavity bounded by said top cover, said sensor and said glass.

57. A packaged sensor sub-assembly as claimed in claim 56 wherein said top cover includes top and bottom surfaces and said transconnect extends radially from said through holes onto the top and bottom surfaces of said top cover.

58. A packaged sensor sub-assembly as claimed in claim 56 wherein said bottom housing, said sensor and said top cover are made selected from the group of aluminum nitride or silicon carbide.

59. A packaged sensor sub-assembly as claimed in claim 56 in combination with a sensor sub-assembly housing comprising a stainless steel housing having an interior and an exterior, said interior includes threads thereon, a ceramic tube resides in said interior of said stainless steel housing, brazing resides intermediate said interior threads of said stainless steel housing and said ceramic tube, and, said brazing secures said ceramic tube and said stainless steel housing together upon heating said brazing; and,
said sensor sub-assembly being glassed to secure said stainless steel housing and said ceramic tube together thereby creating a reference cavity.

60. A sensor sub-assembly housing comprising a stainless steel tube, a ceramic tube having through holes, a reference cavity, and an opening therein, said ceramic tube being partially brazed to said stainless steel tube, said ceramic tube extending outside said stainless steel tube a sufficient length to thermally decouple said stainless steel tube from said sensor.

61. A sensor sub-assembly housing as claimed in claim 60 in combination with a packaged sensor sub-assembly comprising a bottom housing, a sensor having contact pads and a perimeter, said sensor residing in said bottom housing; said through holes fo said ceramic tube being aligned with said contact pads of said sensor, pins and conductive paste, said pins residing in said through holes and engaging said contact pads of said sensors, said conductive paste securing said pins to said through holes, glass securing said sensor, bottom housing and ceramic housing together.

62. A packaged sensor sub-assembly comprising a sensor sub-assembly inserted into and glassed to a kovar header brazed to a stainless steel housing, said sensor sub-assembly comprising a bottom housing, said sensor having contact pads and a perimeter, said sensor residing in said bottom housing, a top cover having through holes therethrough, said through holes being aligned with said contact pads of said sensor, pins and conductive paste, said pins residing in said through holes and engaging said contact pads of said sensors, said conductive paste securing said pins to said through holes, glass securing and sealing said top cover, sensor, and bottom housing together, and, glass securing said pins to said top cover.

63. A packaged sensor sub-assembly as claimed in claim 62 wherein the sensor sub-assembly is first glassed to the Kovar header before said Kovar header is brazed to said stainless steel housing.

64. A method of packaging a sensor sub-assembly comprising the steps of:
inserting a ceramic tube inside a stainless steel housing, said ceramic tube having through holes, and said stainless steel housing includes an interior having threads thereon;
inserting brazing material in the gap intermediate said stainless steel housing and said ceramic tube such that said brazing material is conformal to said interior threads;
heating said brazing material and securing said ceramic tube to said stainless steel housing;
inserting a sensor sub-assembly having contact pads into said stainless steel housing in alignment with said through holes of said ceramic tube and in proximity to said ceramic tube; and,
inserting and heating glass to secure said sensor sub-assembly to said ceramic tube and said stainless steel housing forming a reference cavity.

65. A method of packaging a sensor sub-assembly as claimed in claim 64 further comprising the steps of:
coating pins with paste;
inserting said coated pins into said through holes of said ceramic tube and into engagement with said contact pads; and,
heating said paste to secure said pins to said ceramic tube and contact pads.

66. A method of packaging a sensor sub-assembly as claimed in claim 65 further comprising the steps of:
placing a metal bump on each of said contact pads prior to said step of inserting said sensor sub-assembly having contact pads into said stainless steel housing in alignment with said through holes of said ceramic tube and in proximity to said ceramic tube.

67. A method of packaging a sensor sub-assembly as claimed in claim 65 further comprising the steps of:
inserting a blow-out stopper in said interior of said stainless steel tube prior to said step of heating said brazing material and securing said ceramic tube to said stainless steel housing; and,
attaching a particulate shield to said stainless steel housing to protect said sensor sub-assembly.

68. A method of packaging a sensor sub-assembly as claimed in claim 65 wherein said paste is a conductive paste.

69. A method of packaging a sensor sub-assembly as claimed in claim 65 wherein said paste is a nonconductive paste.

70. A method of packaging a sensor sub-assembly in a stainless steel housing having an interior and an exterior, comprising the steps of:

coating pins with paste;

inserting said coated pins into a ceramic tube having through holes;

placing said coated pins inside said through holes in said ceramic tube and heating said paste to secure said pins to said ceramic tube;

smoothening one end of said ceramic tube and said pins located therein such that said end of said pins are coplanar with said ceramic tube;

attaching said pins to bumps on contact pads of a sensor;

heating said ceramic tube and said sensor and bumps on said contact pads;

prewetting the interior of a stainless steel housing with a glass paste;

inserting said ceramic tube and sensor in said interior of said prewet stainless steel housing;

inserting additional glass to secure said sensor to said ceramic tube and said stainless steel housing to form a reference cavity;

firing said ceramic tube, said sensor and said stainless steel housing to cure said glass.

71. A method of packaging a sensor sub-assembly in a stainless steel housing having an interior and an exterior as claimed in claim 70 wherein said step of firing said ceramic tube, said sensor and said stainless steel housing to cure said glass is performed at 800 degrees centigrade for 30 in a nitrogen ambient environment.

72. A method of packaging a sensor sub-assembly in a stainless steel housing having an interior and an exterior as claimed in claim 70 wherein said step of heating said ceramic tube and said sensor and bumps on said contact pads is performed at 650 degrees centigrade.

73. A method of packaging a sensor sub-assembly in an aluminum nitride header partially secured within a stainless steel housing having an interior, an exterior and a reference cavity formed therein, said sensor sub-assembly including contact pads, comprising the steps of:

coating said aluminum nitride header with a metallic material;

inserting said aluminum nitride header having four through holes therein into said stainless steel housing;

attaching said metallic material to said stainless steel housing;

coating through hole openings with conductive paste;

inserting conductive pins in said through holes coating said holes with conductive paste;

heating said header, said stainless steel housing, said pins and said conductive paste so as to cure and harden said conductive paste;

reapplying said conductive paste on said cured and hardened conductive paste which is proximate said reference cavity;

inserting said sensor sub-assembly in said reference cavity such that said sensor contact pads are aligned with said through holes of said aluminum nitride header;

heating and bonding said sensor sub-assembly to said reference cavity such that electrical conductivity may be established between said contact pads and said pins; and, sealing between said aluminum nitride header and said sensor locking air between said reference cavity and said sensor.

74. A method of packaging a sensor sub-assembly as claimed in claim 73 wherein said step of attaching said metallic material to said stainless steel housing is performed by laser welding.

75. A method of packaging a sensor sub-assembly as claimed in claim 73 wherein said step of attaching said metallic material to said stainless steel housing is performed by brazing.

76. A method of packaging a sensor sub-assembly as claimed in claim 73 wherein said metallic material is nickel.

* * * * *

UNITED STATES PATENT AND TRADEMARK OFFICE
CERTIFICATE OF CORRECTION

PATENT NO. : 6,845,664 B1
DATED : January 25, 2005
INVENTOR(S) : Robert S. Okojie It is certified that error appears in the above-identified patent and that said Letters Patent is hereby corrected as shown below:

Column 1,
Line 48, after "U.S. Pat. No. 6,319,757" delete "BI" and insert -- B1 --.

Column 10,
Line 64, after "view" delete "400".
Line 66, after "substrate" delete "402" and insert -- 400 --.

Column 11,
Line 41, after "array" delete "400" and insert -- of the bottom cover substrate --.

Column 18,
Line 15, after "cover" delete "407" and insert -- 400 --.

Column 25,
Line 36, after "30" insert -- minutes --.

Signed and Sealed this

Thirty-first Day of May, 2005

JON W. DUDAS
*Director of the United States Patent and Trademark Office*